(12) United States Patent
Lin et al.

(10) Patent No.: US 9,705,052 B1
(45) Date of Patent: Jul. 11, 2017

(54) LED PACKAGE STRUCTURE

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Yu-Chou Lin, New Taipei (TW); Chen-Hsiu Lin, New Taipei (TW); Chih-Yuan Chen, New Taipei (TW)

(73) Assignees: LITE-ON OPTO TECHNOLOGY (CHANGZHOU) CO., LTD., Changzhou, Jiangsu (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/338,289

(22) Filed: Oct. 28, 2016

(30) Foreign Application Priority Data

Jun. 8, 2016 (CN) .......................... 2016 1 0405811

(51) Int. Cl.
| | |
|---|---|
| *H01L 21/02* | (2006.01) |
| *H01L 33/50* | (2010.01) |
| *H01L 33/56* | (2010.01) |
| *H01L 33/62* | (2010.01) |
| *H01L 33/60* | (2010.01) |

(Continued)

(52) U.S. Cl.
CPC .......... *H01L 33/505* (2013.01); *G02B 5/0278* (2013.01); *H01L 25/0753* (2013.01); *H01L 25/167* (2013.01); *H01L 27/0248* (2013.01); *H01L 28/20* (2013.01); *H01L 29/866* (2013.01); *H01L 33/502* (2013.01); *H01L 33/56* (2013.01); *H01L 33/58* (2013.01); *H01L 33/60* (2013.01); *H01L 33/62* (2013.01); *H01L 33/642* (2013.01); *H01L 2933/005* (2013.01); *H01L 2933/0041* (2013.01); *H01L 2933/0058* (2013.01);

(Continued)

(58) Field of Classification Search
CPC .......... H01L 2924/12041; H01L 33/46; H01L 33/505; H01L 33/647; H01L 33/10; H01L 33/405; H01L 33/52; H01L 33/501
See application file for complete search history.

(56) References Cited

U.S. PATENT DOCUMENTS

| | | | |
|---|---|---|---|
| 8,783,911 B2 * | 7/2014 | Wu | F21V 29/70 362/249.02 |
| 9,012,248 B2 * | 4/2015 | Chen | H01L 24/97 257/100 |

(Continued)

*Primary Examiner* — Roy Potter
(74) *Attorney, Agent, or Firm* — Li & Cai Intellectual Property (USA) Office

(57) ABSTRACT

An LED package structure includes a substrate, a circuit layer and an insulating layer both disposed on the substrate, a light-emitting unit, and a reflective housing integrally formed with the insulating layer. The light-emitting unit includes an LED chip and a fluorescent body encapsulating the LED chip. The light-emitting unit is mounted on the insulating layer and the circuit layer. The fluorescent body of the light emitting unit is spaced apart from the circuit layer with a gap in a range of 3~10 μm. The reflective housing is formed on the insulating layer and the circuit layer and is further filled within the gap. A top plane of the reflective housing arranged away from the substrate is lower than or equal to that of the light-emitting unit, and a distance between the two top planes is in a range of 0~30 μm.

20 Claims, 29 Drawing Sheets

(51) Int. Cl.
*H01L 29/866* (2006.01)
*H01L 25/16* (2006.01)
*H01L 33/58* (2010.01)
*H01L 33/64* (2010.01)
*H01L 49/02* (2006.01)
*H01L 25/075* (2006.01)
*H01L 27/02* (2006.01)
*G02B 5/02* (2006.01)

(52) U.S. Cl.
CPC .............. *H01L 2933/0066* (2013.01); *H01L 2933/0075* (2013.01)

(56) References Cited

U.S. PATENT DOCUMENTS 9,431,462 B2 * 8/2016 Tischler ................ H01L 27/156
9,647,189 B2 * 5/2017 Tischler ................ H01L 33/62

* cited by examiner

LED PACKAGE STRUCTURE

BACKGROUND OF THE INVENTION

1. Field of the Invention

The instant invention relates to an LED package structure; in particular, to a light-emitting unit of an LED package structure including an LED chip and a fluorescent body.

2. Description of Related Art

The conventional LED package structure includes a substrate, a circuit layer disposed on the substrate, an LED chip mounted on the circuit layer, and a fluorescent body covering the LED chip. However, the fluorescent body also covers the circuit layer, such that an electrical error due to a die bonding area covered by the fluorescent body is easily generated between the LED chip and the circuit layer.

SUMMARY OF THE INVENTION

The instant disclosure provides an LED package structure for effectively solving the problem generated from the conventional LED package structure.

In summary, the light-emitting unit of the LED package structure of the instant disclosure is disposed on the substrate and the fluorescent body of the light-emitting unit spaced apart from the substrate with the gap in a range of 3 μm~10 μm. The gap is filled with the reflective housing (or the light transparent layer), such that the electrical connection between the light-emitting unit and the circuit layer is not influenced by the fluorescent body, thereby the poor electrical connection can be improved. In addition, the top plane of the reflective housing is equal to that of the light-emitting unit, or the top plane of the reflective housing is lower than that of the light-emitting unit, and the distance between the two top planes is zero or in a range of 1~30 μm, thus problems about light shape and poor brightness can be avoided.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

First Embodiment

Please refer to FIGS. 1 through 11D, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Figure 1:
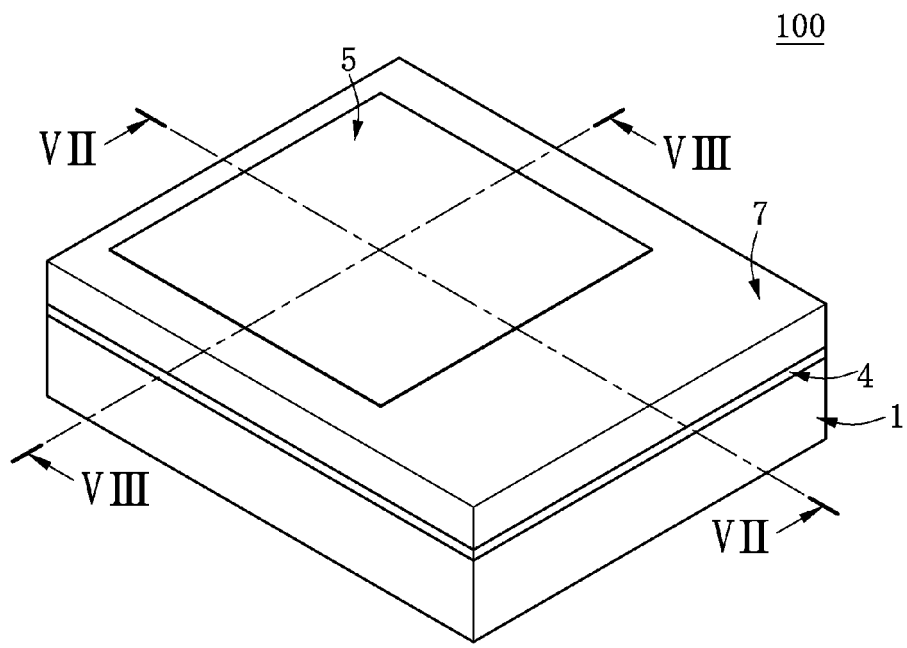
FIG. 1 is a perspective view showing an LED package structure according to a first embodiment of the instant disclosure.
Figure 2:
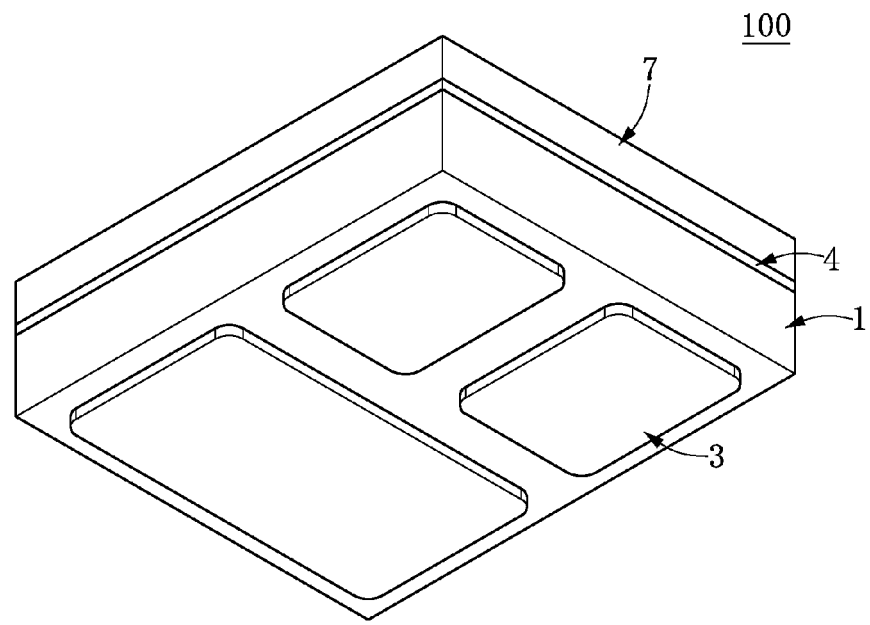
FIG. 2 is a perspective view of FIG. 1 from another perspective.
Figure 3:
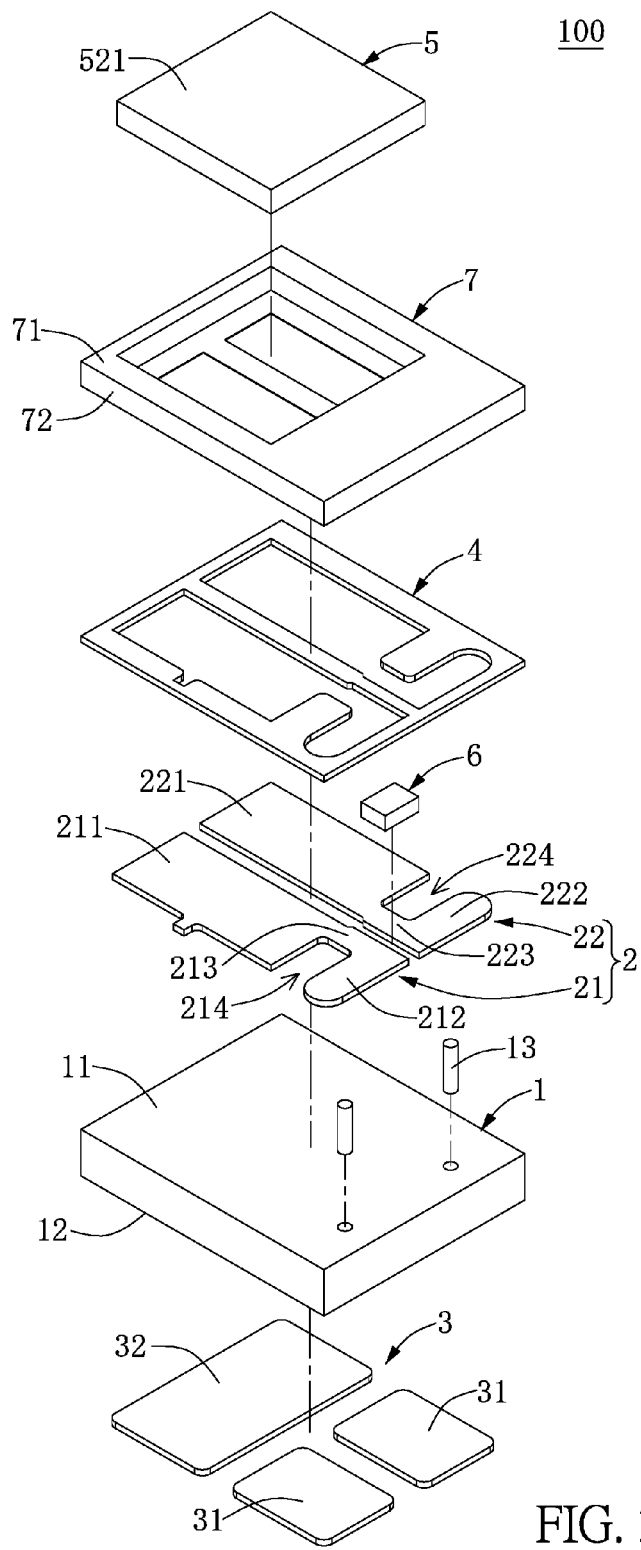
FIG. 3 is an exploded view of FIG. 1.

Please refer to FIGS. 1 through 3, which show an LED package structure 100. The LED package structure 100 includes a substrate 1, a circuit layer 2, a soldering pad 3, an insulating layer 4, a light-emitting unit 5, a Zener diode chip 6, and a reflective housing 7 integrally formed with the insulating layer 4. The circuit layer 2 and the soldering pad 3 are respectively disposed on two opposite surfaces of the substrate 1. The insulating layer 4 is disposed on the substrate 1 and is shaped complementarily with the circuit layer 2. The light-emitting unit 5 and the Zener diode chip 6 are both disposed on the circuit layer 2 and the insulating layer 4. The following description discloses the construction of each component of the LED package structure 100, and then discloses the relative features of the components of the LED package structure 100.

Figure 4:
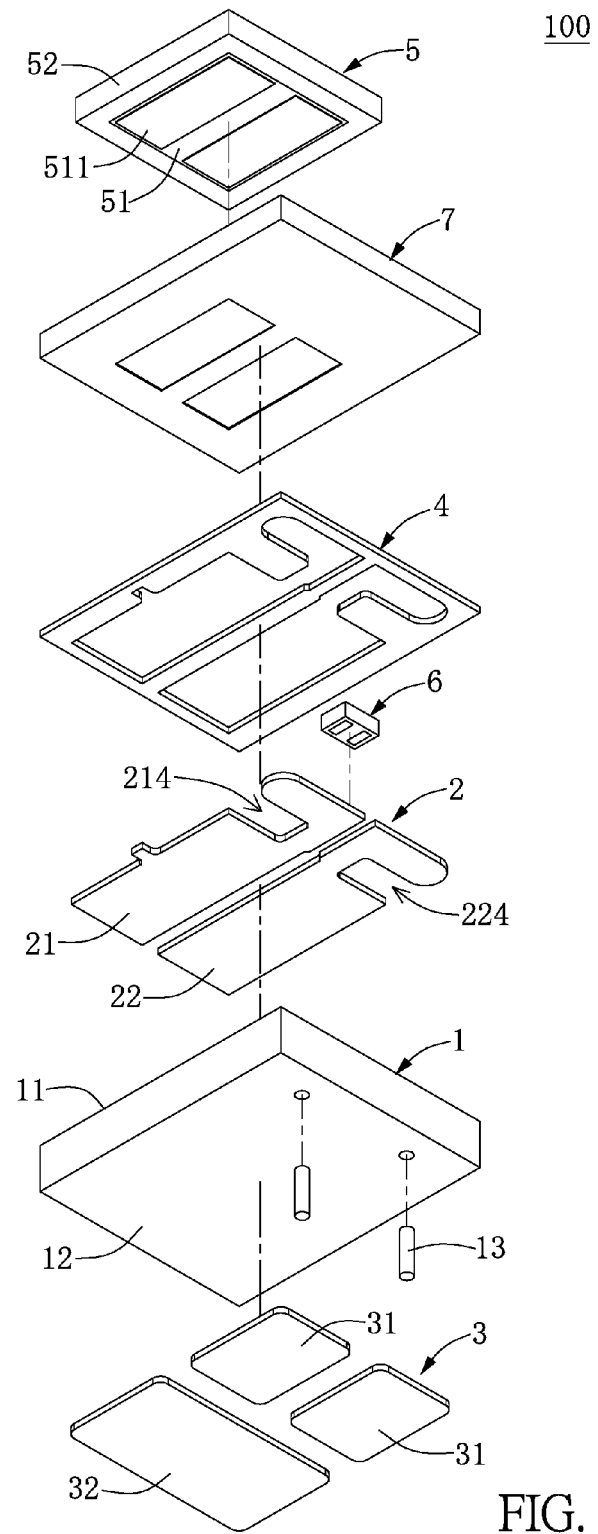
FIG. 4 is an exploded view of FIG. 2.

As shown in FIGS. 3 and 4, the substrate 1 having a substantially rectangular shape includes a first surface 11 and a second surface 12 opposing to the first surface 11. The substrate 1 includes two conductive pillars 13 embedded therein, and two opposite ends of each conductive pillar 13 are respectively exposed from the first surface 11 and the second surface 12. The circuit layer 2 is disposed on the first surface 11 of the substrate 1, and the soldering pad 3 is disposed on the second surface 12 of the substrate 1. The circuit layer 2 includes a first electrode 21 and a second electrode 22 spaced apart from the first electrode 21. The first electrode 21 and the second electrode 22 are substantially in a mirror symmetry, but the instant disclosure is not limited thereto.

Figure 5:
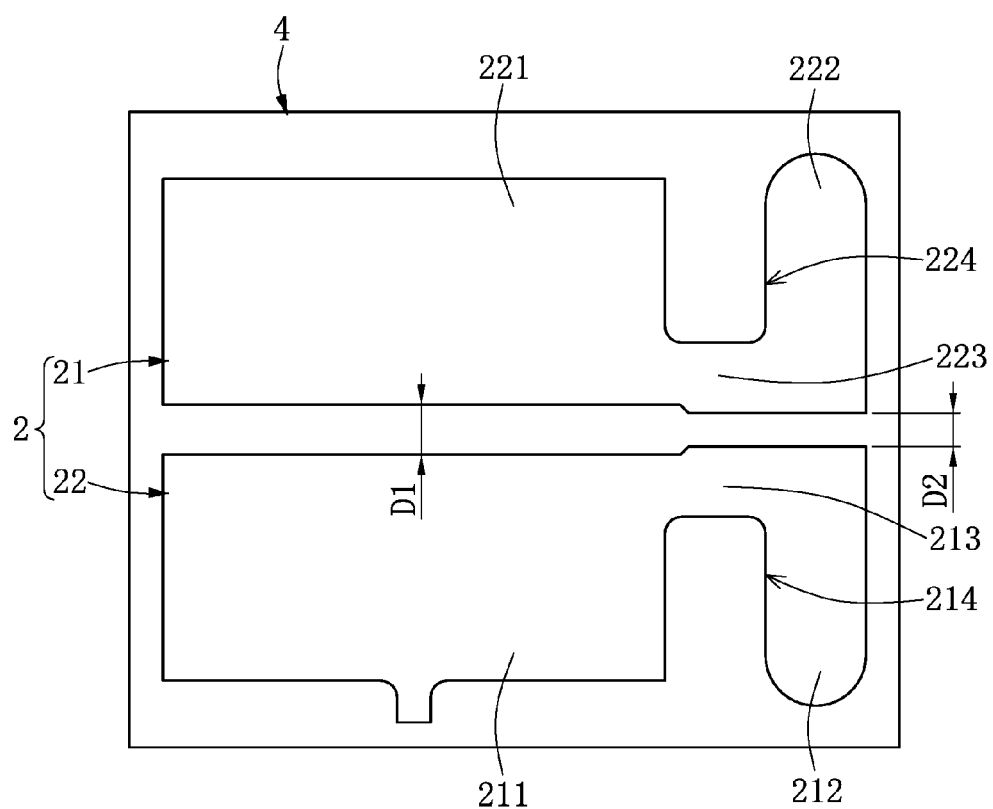
FIG. 5 is a top view of FIG. 1 with the light-emitting unit and the reflective housing omitted.

As shown in FIGS. 3, 4, and 5, the first electrode 21 includes a first bonding region 211, a first extending region 212, and a first connecting region 213 connected to the first bonding region 211 and the first extending region 212. The first bonding region 211, the first extending region 212, and the first connecting region 213 are arranged in a direction parallel to a longitudinal direction of the substrate 1. The area of the first bonding region 211 is greater than that of the first extending region 212, and the area of the first extending region 212 is greater than that of the first connecting region 213.

The second electrode 22 includes a second bonding region 221, a second extending region 222, and a second connecting region 223 connected to the second bonding region 221 and the second extending region 222. The second bonding region 221, the second extending region 222, and the second connecting region 223 are arranged in a direction parallel to the longitudinal direction of the substrate 1. The area of the second bonding region 221 is greater than that of the second extending region 222, and the area of the second extending region 222 is greater than that of the second connecting region 223.

The second bonding region 221, the second extending region 222, and the second connecting region 223 are respectively arranged adjacent to the first bonding region 211, the first extending region 212, and the first connecting region 213. A distance D1 between the first bonding region 211 and the second bonding region 221 is greater than a distance D2 between the first extending region 212 and the second extending region 222. Specifically, the distance D1 between the first bonding region 211 and the second bonding region 221 is corresponding to (i.e., substantially identical to) a distance between two chip electrodes 511 of the light-emitting unit 5. That is to say, the distance D1 can be changed according to the distance between two chip electrodes 511 of the light-emitting unit 5. The distance D2 between the first extending region 212 and the second extending region 222 is corresponding to (i.e., substantially identical to) a distance between two chip electrodes (not labeled) of the Zener diode chip 6. That is to say, the distance D2 can be changed according to the distance between two chip electrodes of the Zener diode chip 6. Thus, each of the light-emitting unit 5 and the Zener diode chip 6 can be mounted on the first electrode 21 and the second electrode 22 for the purpose of reducing the size of the circuit layer 2.

In the instant embodiment, the adjacent inner edges of the first bonding region 211 and the second bonding region 221 are parallel to each other and the distance D1 between the first bonding region 211 and the second bonding region 221 is in a range of 150 µm~200 µm (i.e., 150 µm is a preferable value), the adjacent inner edges of the first extending region 212 and the second extending region 222 are parallel to each other and the distance D2 between the first extending region 212 and the second extending region 222 is in a range of 90 µm~150 µm (i.e., 90 µm is a preferable value), and a distance between the adjacent inner edges of the first connecting region 213 and the second connecting region 223 is gradually decreased in a direction from the distance D1 to the distance D2 (i.e., the distance between the adjacent inner edges of the first connecting region 213 and the second connecting region 223 gradually decreases from 150 µm to 90 µm). However, the instant disclosure is not limited to the above conditions.

Moreover, a U-shaped first notch 214 is defined by the first bonding region 211, the first connecting region 213, and the first extending region 212. A U-shaped second notch 224 is defined by the second bonding region 221, the second connecting region 223, and the second extending region 222. An opening of the first notch 214 and an opening of the second notch 224 respectively face toward two sides away from each other in a width direction of the substrate 1, such that an area of the circuit layer 2 covering the first surface 11 of the substrate 1 can be reduced, thereby increasing an area of the insulating layer 4 covering the first surface 11 of the substrate 1. Accordingly, the insulating layer 4 and the substrate 1 are provided with a better combination performance to prevent the reflective housing 7 from peeling off during in a manufacturing process and to prevent the reflective housing 7 from cracks during a sawing process.

As shown in FIGS. 3 and 4, the soldering pad 3 includes two electrode soldering pads 31 and a heat-dissipating soldering pad 32. The two electrode soldering pads 31 are electrically connected to the circuit layer 2, and the two electrode soldering pads 31 are electrically connected to the light-emitting unit 5 through the circuit layer 2. Specifically, an area of each electrode soldering pad 31 is smaller than that of the heat-dissipating soldering pad 21, and the area of each electrode soldering pad 31 in the instant embodiment is smaller than half of the area of the heat-dissipating soldering pad 21, but the instant disclosure is not limited thereto. Moreover, the two electrode soldering pads 31 are respectively arranged under the first extending region 212 and the second extending region 222, and the two electrode soldering pads 31 are respectively and electrically connected to the first extending region 212 and the second extending region 222 through the two conductive pillars 13. The heat-dissipating soldering pad 32 is arranged on one side of the two electrode soldering pads 31 and is under the first bonding region 211 and the second bonding region 221 (or is under the LED chip 51) for dissipating heat generated from the light-emitting unit 5.

The insulating layer 4 is disposed on the first surface 11 of the substrate 1, and the insulating layer 4 and the circuit layer 2 are shaped complementarily. That is to say, the insulating layer 4 and the circuit layer 2 are coplanar and are arranged with a complementary shape. In other words, the insulating layer 4 is disposed on a portion of the first surface 11, which is not disposed with the circuit layer 2, and the side edge of the insulating layer 4 is aligned with the side edge of the substrate 1. Thus, a portion of the insulating layer 4 is arranged between the first electrode 21 and the second electrode 22 such that a current leakage can be prevented between the first electrode 21 and the second electrode 22 of the circuit layer 2.

The light-emitting unit 5 in the instant embodiment is a chip scale package (CSP) and includes an LED chip 51 and a fluorescent body 52 encapsulating the LED chip 51. The relationship of the LED chip 51 and the fluorescent body 52 can be changed according to the designer's demand, such as the light-emitting unit 5 shown in FIGS. 6A through 6E or the light-emitting unit 5 having a reflecting cup 53 at least surrounded a side surface 513 of the LED chip 51, shown in FIGS. 6F through 6J. It should be noted that the light-emitting unit 5 in the instant embodiment is substantially symmetrical to a central axis thereof, so FIGS. 6A through 6J are shown in cross-sectional view.

Figure 6A:
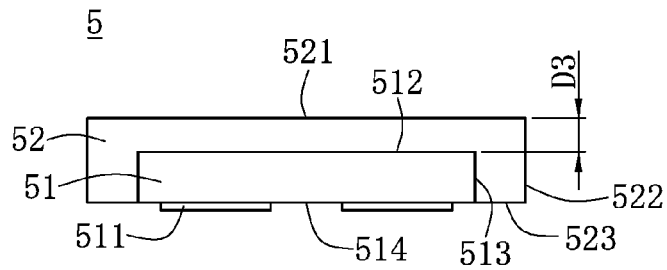
FIGS. 6A~6J are cross-sectional views showing the light-emitting unit of the LED package structure.

As shown in FIG. 6A, the fluorescent body 52 encapsulates a top surface 512 of the LED chip 51 and a side surface 513 of the LED chip 51 and exposes the two chip electrodes 511 arranged on a bottom of the LED chip 51, and a bottom surface 523 of the fluorescent body 52 is coplanar with a bottom surface 514 of the LED chip 51. Specifically, the top surface 521 of the fluorescent body 52 (i.e., the top plane 521) is parallel to the top surface 512 of the LED chip 51, a side surface 522 of the fluorescent body 52 is parallel to the side surface 513 of the LED chip 51, and a smallest distance D3 between the top surface 521 of the fluorescent body 52 and the top surface 512 of the LED chip 51 is in a range of 50 μm~200 μm, but the instant disclosure is not limited thereto. Thus, a light leakage of the LED chip 51 can be improved by using the fluorescent body 52 to encapsulate the top surface 512 and the side surface 513 of the LED chip 51.

Figure 6B:
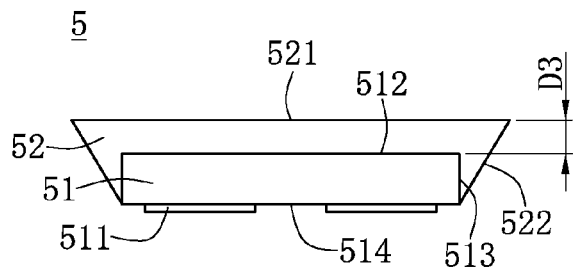

As shown in FIG. 6B, the fluorescent body 52 encapsulates the top surface 512 of the LED chip 51 and the side surface 513 of the LED chip 51 and exposes the two chip electrodes 511 arranged on the bottom of the LED chip 51, and a bottom edge of the fluorescent body 52 is aligned with the bottom surface 514 of the LED chip 51. The top surface 521 of the fluorescent body 52 is parallel to the top surface 512 of the LED chip 51, and the side surface 522 of the fluorescent body 52 is non-parallel to the side surface 513 of the LED chip 51. In other words, the top surface 521 and the side surface 522 of the fluorescent body 52 have an acute angle, and the side surface 522 of the fluorescent body 52 and the side surface 513 of the LED chip 51 have an acute angle.

Figure 6C:
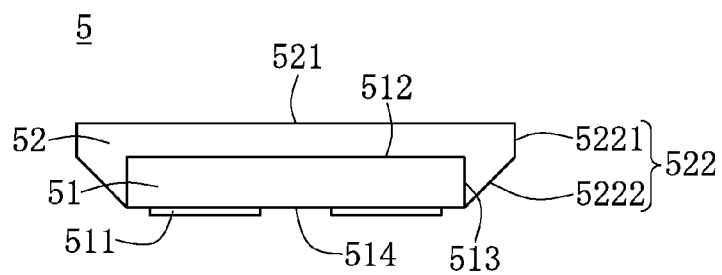

As shown in FIG. 6C, the fluorescent body 52 encapsulates the top surface 512 of the LED chip 51 and the side surface 513 of the LED chip 51 and exposes the two chip electrodes 511 arranged on the bottom of the LED chip 51, and a bottom edge of the fluorescent body 52 is aligned with the bottom surface 514 of the LED chip 51. The top surface 521 of the fluorescent body 52 is parallel to the top surface 512 of the LED chip 51. The side surface 522 of the fluorescent body 52 includes a first side surface 5221 and a second side surface 5222. The first side surface 5221 and the top surface 521 of the fluorescent body 52 have a right angle, the first side surface 5221 and the second side surface 5222 have an obtuse angle, and the second side surface 5222 of the fluorescent body 52 and the side surface 513 of the LED chip 51 have an acute angle.

Figure 6D:
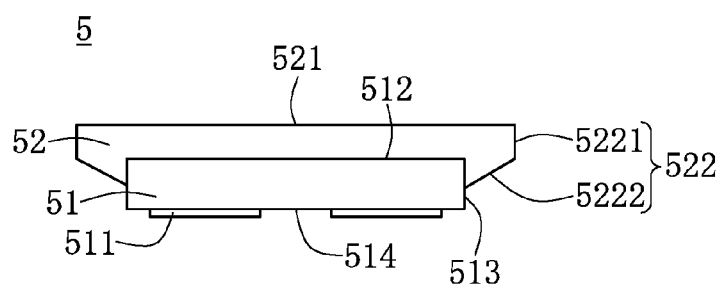

As shown in FIG. 6D, the fluorescent body 52 encapsulates the top surface 512 of the LED chip 51 and part (i.e., the upper part) of the side surface 513 of the LED chip 51, and the fluorescent body 52 exposes the two chip electrodes 511 arranged on the bottom of the LED chip 51 and the other part (i.e., the lower part) of the side surface 513 of the LED chip 51. The top surface 521 of the fluorescent body 52 is parallel to the top surface 512 of the LED chip 51. The side surface 522 of the fluorescent body 52 includes a first side surface 5221 and a second side surface 5222. The first side surface 5221 and the top surface 521 of the fluorescent body 52 have a right angle, the first side surface 5221 and the second side surface 5222 have an obtuse angle, and the second side surface 5222 of the fluorescent body 52 and the side surface 513 of the LED chip 51 have an acute angle.

Figure 6E:
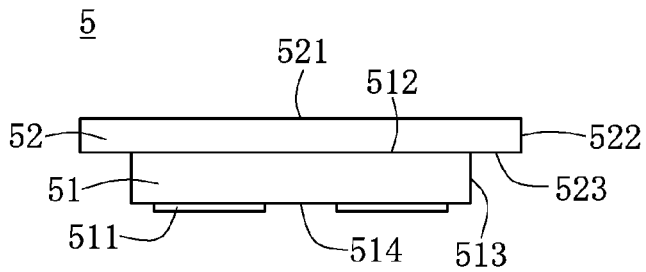

As shown in FIG. 6E, the fluorescent body 52 is a phosphor sheet, and the top surface 521 of the fluorescent body 52 is longer than the top surface 512 of the LED chip 51. The fluorescent body 52 only covers the top surface 512 of the LED chip 51, and the fluorescent body 52 exposes the two chip electrodes 511 arranged on the bottom of the LED chip 51 and the side surface 513 of the LED chip 51. The top surface 521 of the fluorescent body 52 is parallel to the top surface 512 of the LED chip 51. The bottom surface 523 of the fluorescent body 52 is coplanar with the top surface 512 of the LED chip 51.

Figure 6F:
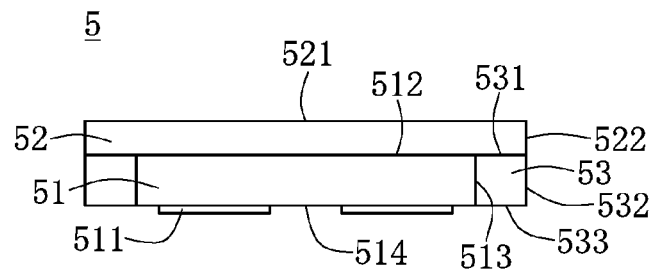

As shown in FIG. 6F, the light-emitting unit 5 further includes a reflecting cup 53 formed on the side surface 513 of the LED chip 51. A top surface 531 of the reflecting cup 53 is coplanar with the top surface 512 of the LED chip 51, and a bottom surface 533 of the reflecting cup 53 is coplanar with the bottom surface 514 of the LED chip 51. The fluorescent body 52 is disposed on the top surface 531 of the reflecting cup 53 and the top surface 512 of the LED chip 51, and the side surface 522 of the fluorescent body 52 is coplanar with a side surface 532 of the reflecting cup 53.

Figure 6G:
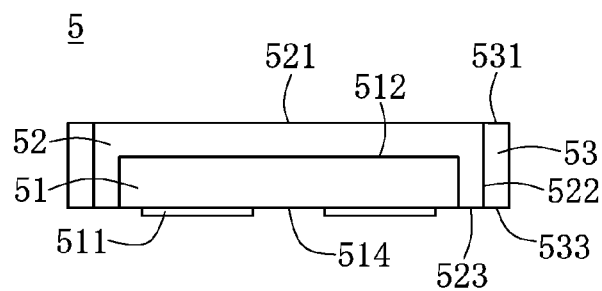

Please refer to FIG. 6G, which shows a variation of FIG. 6A. The light-emitting unit 5 further includes a reflecting cup 53 formed on the side surface 522 of the fluorescent body 52. The top surface 531 of the reflecting cup 53 is coplanar with the top surface 521 of the fluorescent body 52. The bottom surface 533 of the reflecting cup 53 is coplanar with the bottom surface 523 of the fluorescent body 52 and the bottom surface 514 of the LED chip 51.

Figure 6H:
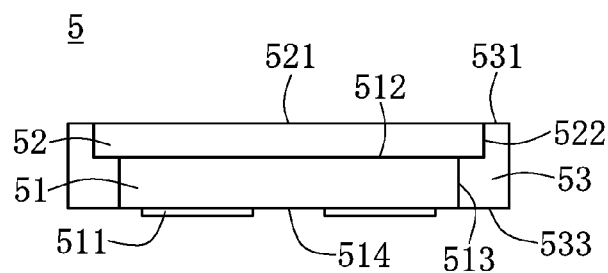

Please refer to FIG. 6H, which shows a variation of FIG. 6E. The light-emitting unit 5 further includes a reflecting cup 53 formed on the side surface 522 of the fluorescent body 52 and the side surface 513 of the LED chip 51. The top surface 531 of the reflecting cup 53 is coplanar with the top surface 521 of the fluorescent body 52. The bottom surface 533 of the reflecting cup 53 is coplanar with the bottom surface 514 of the LED chip 51.

Figure 6I:
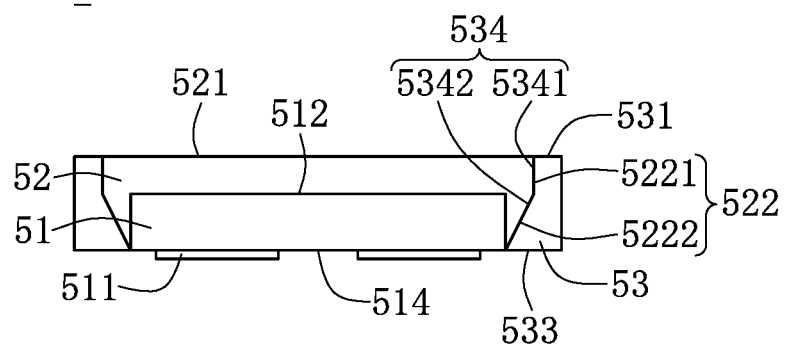

Please refer to FIG. 6I, which shows a variation of FIG. 6C. The light-emitting unit 5 further includes a reflecting cup 53 formed on the side surface 522 of the fluorescent body 52. The top surface 531 of the reflecting cup 53 is coplanar with the top surface 521 of the fluorescent body 52. The bottom surface 533 of the reflecting cup 53 is coplanar with the bottom surface 514 of the LED chip 51. An inner wall 534 of the reflecting cup 53 is a two-stage wall having a first inner wall 5341 and a second inner wall 5342. The first inner wall 5341 of the reflecting cup 53 is entirely contacted with the first side surface 5221 of the fluorescent body 52, and the second inner wall 5342 of the reflecting cup 53 is entirely contacted with the second side surface 5222 of the fluorescent body 52.

Figure 6J:
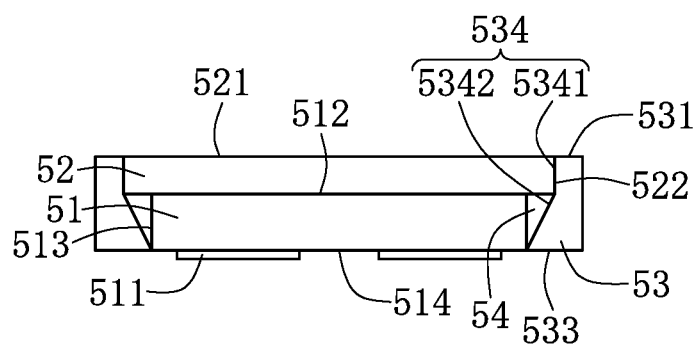
Figure 7:
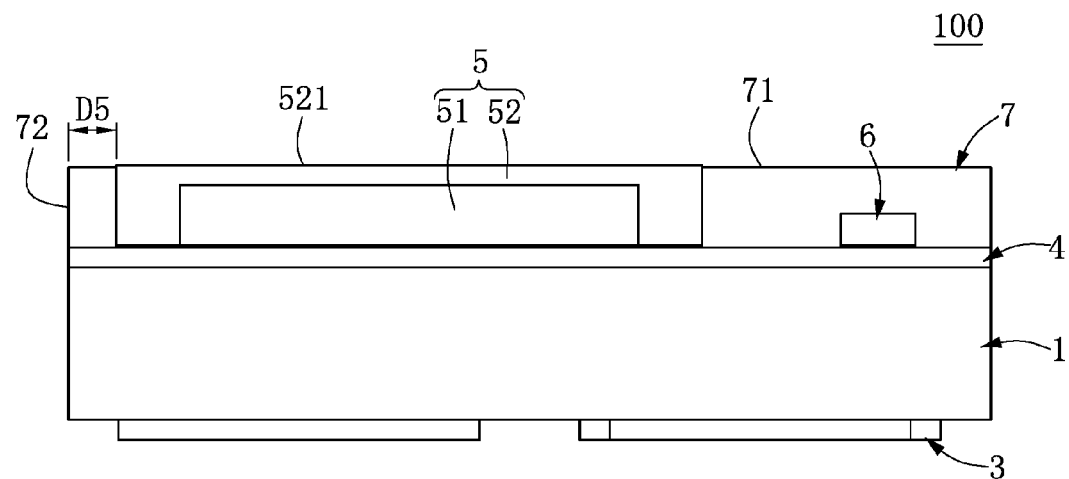
FIG. 7 is a cross-sectional view of FIG. 1 along line VII-VII.
Figure 8:
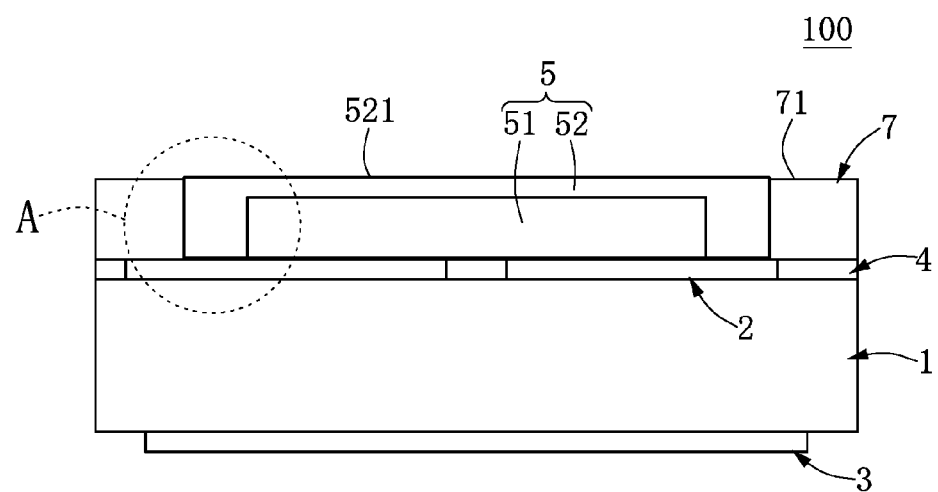
FIG. 8 is a cross-sectional view of FIG. 1 along line VIII-VIII.

Please refer to FIG. 6J, which shows a variation of FIG. 6I. The light-emitting unit 5 further includes a transparent body 54 at least surrounded the side surface 513 of the LED chip 51. A top surface of the transparent body 54 is coplanar with the top surface 512 of the LED chip 51. The fluorescent body 52 is disposed on the top surface 512 of the LED chip 51 and the top surface of the transparent body 54, and the reflecting cup 53 is arranged outside the fluorescent body 52 and the transparent body 54. The top surface 531 of the reflecting cup 53 is coplanar with the top surface 521 of the fluorescent body 52. The bottom surface 533 of the reflecting cup 53 is coplanar with the bottom surface 514 of the LED chip 51. An inner wall 534 of the reflecting cup 53 is a two-stage wall having a first inner wall 5341 and a second inner wall 5342. The first inner wall 5341 of the reflecting cup 53 is entirely contacted with the side surface 522 of the fluorescent body 52, and the second inner wall 5342 of the reflecting cup 53 is entirely connected to the side surface of the transparent body 54.

For each of the light-emitting units 5 shown in FIGS. 6B through 6J, the LED chip 51 has a thickness of about 150 μm, the smallest distance D3 (shown in FIG. 6B) between the top surface 512 of the LED chip 51 and the top surface 521 of the fluorescent body 52 is in a range of 100 μm~180 μm, and a side portion of the fluorescent body 52 extended out of the top surface 512 of the LED chip 51 has a length in a range of 50 μm~150 μm.

Figure 9:
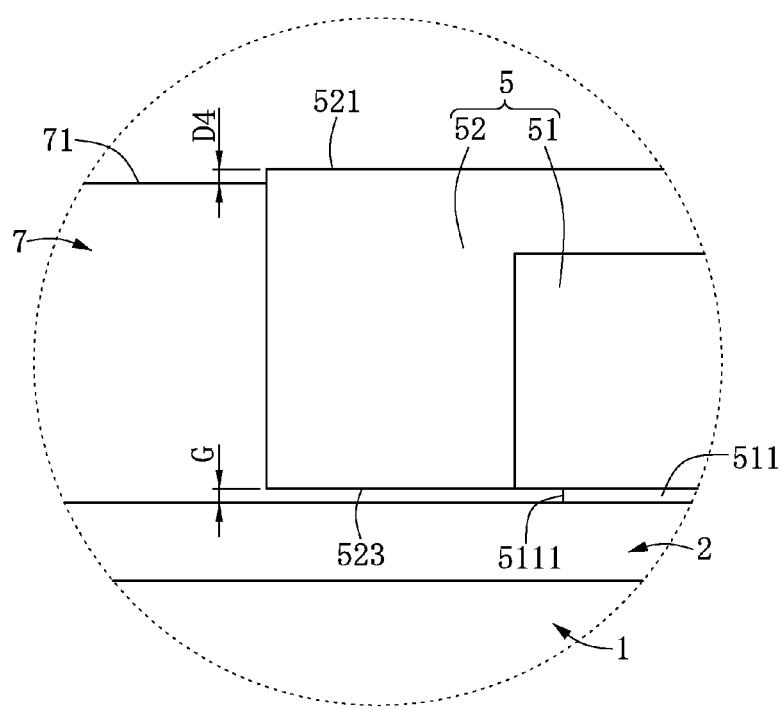
FIG. 9 is an enlarged view of the A portion of FIG. 8.

As shown in FIG. 3 and FIGS. 7 through 9, the light-emitting unit 5 is mounted on the circuit layer 2 and the insulating layer 4, and the fluorescent body 52 is spaced apart from the insulating layer 4 (shown in FIG. 9). The two chip electrodes 511 of the LED chip 51 are respectively mounted on the first bonding region 211 and the second bonding region 221. The Zener diode chip 6 is in a flip chip manner, and the two chip electrodes of the Zener diode chip 6 are respectively mounted on the first extending region 212 and the second extending region 222, but the instant disclosure is not limited thereto. For example, the Zener diode chip 6 can be in a wire-bonding manner, so that the Zener diode chip 6 is mounted on the first extending region 212 and is electrically connected to the second extending region 222 by wire-bonding; or the Zener diode chip 6 is mounted on the second extending region 222 and is electrically connected to the first extending region 212 by wire-bonding. The fluorescent body 52 is spaced apart from the circuit layer 2 with a gap G (as shown in FIG. 9) having a range of 3 μm~10 μm, such that the electrical connection between the light-emitting unit 5 and the circuit layer 2 is not influenced by the fluorescent body 52, thereby poor electrical connection can be improved.

The reflective housing 7 is disposed on the insulating layer 4. Specifically, the material of the reflective housing 7 in the instant embodiment is identical to that of the insulating layer 4 (i.e., white silicone resin), and the reflective housing 7 and the insulating layer 4 are integrally formed in one piece. The reflective housing 7 in the instant embodiment is configured to reflect at least 80% of light emitted from the light-emitting unit 5, but the instant disclosure is not limited thereto.

The reflective housing 7 is disposed on the insulating layer 4 and the circuit layer 2 to surround the light-emitting unit 5, and the gap G is further filled within the reflective housing 7 (as shown in FIG. 9), such that the reflective housing 7 covers the side surface of the light-emitting unit 5, a side surface 5111 of each chip electrode 511 of the light-emitting unit 5, and the bottom surface 523 of the fluorescent body 52, and the Zener diode chip 6 is embedded in the reflective housing 7. The reflective housing 7 includes a top plane 71 and an outer lateral surface 72. A distance between the top plane 71 of the reflective housing 7 and the first surface 11 of the substrate 1 is less than or equal to a distance between the top plane 521 of the light-emitting unit 5 and the first surface 11 of the substrate 1. That is to say, the top plane 71 of the reflective housing 7 is substantially lower than or equal to the top plane 521 of the light-emitting unit 5. A distance D4 (shown in FIG. 9) between the two top planes 71, 521 is zero or in a range of 1~30 μm (i.e., 0~30 μm). Specifically, the two top planes 71, 521 in the instant embodiment are parallel to each other, and the distance D4 between the two top planes 71, 521 is preferably in a range of 15 μm~30 μm, but the instant disclosure is not limited thereto. The outer lateral surface 72 of the reflective housing 7 is aligned with the side edge of the substrate 1 and the side edge of the insulating layer 4. A smallest distance D5 (shown in FIG. 7) between the outer lateral surface 72 of the reflective housing 7 and the side surface of the light-emitting unit 5 is more than or equal to 100 μm, and the smallest distance D5 is preferably in a range of 100 μm~150 μm. Thus, the forward light efficiency of the light-emitting unit 5 can be effectively increased and the yellow ring and blue ring can be avoided by forming the reflective housing 7. Moreover, the Zener diode chip 6 is embedded in the reflective housing 7, such that the light efficiency of the LED package structure 100 is not influenced by the Zener diode chip 6.

Figure 10:
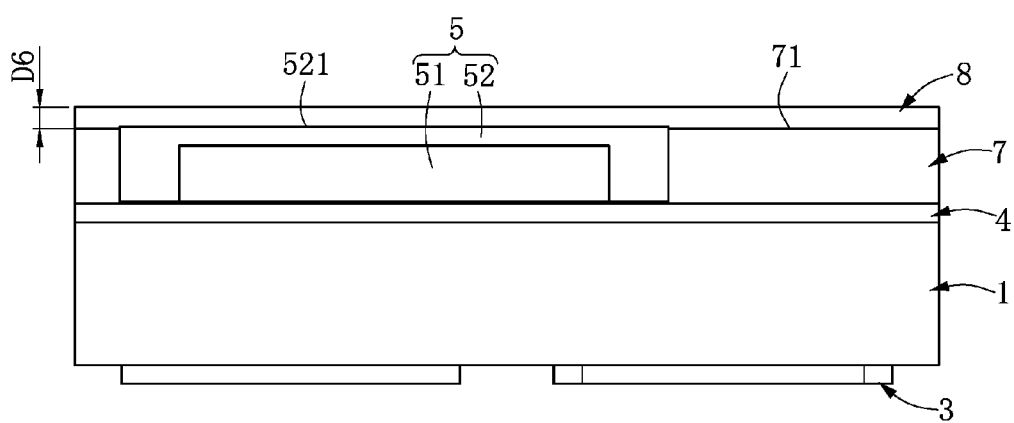
FIG. 10 is a cross-sectional view of FIG. 1 along line VII-VII that the light diffusion layer is added.

In addition, as shown in FIG. 10, the LED package structure 100 in the instant embodiment can further include a light diffusion layer 8 disposed on the reflective housing 7 and the fluorescent body 52. Specifically, the light diffusion layer 8 in the instant embodiment is disposed on the top plane 521 of the fluorescent body 52 and the top plane 71 of the reflective housing 7. A thickness D6 of the light diffusion layer 8 is less than or equal to 50 μm, and the light diffusion layer 8 includes silica or titanium dioxide having a weight percent of 2 wt %~5 wt %, but the instant disclosure is not limited thereto. Thus, the color uniformity of the LED package structure 100 can be effectively increased by disposing the light diffusion layer 8.

The following description discloses a manufacturing method of the LED package structure 100. Please refer to FIGS. 11A through 11D, which show the steps S110 through S150 of the manufacturing method. The detailed relationship between the components of the LED package structure 100 has been disclosed in the above description, so the following description does not state it again.

Figure 11A:
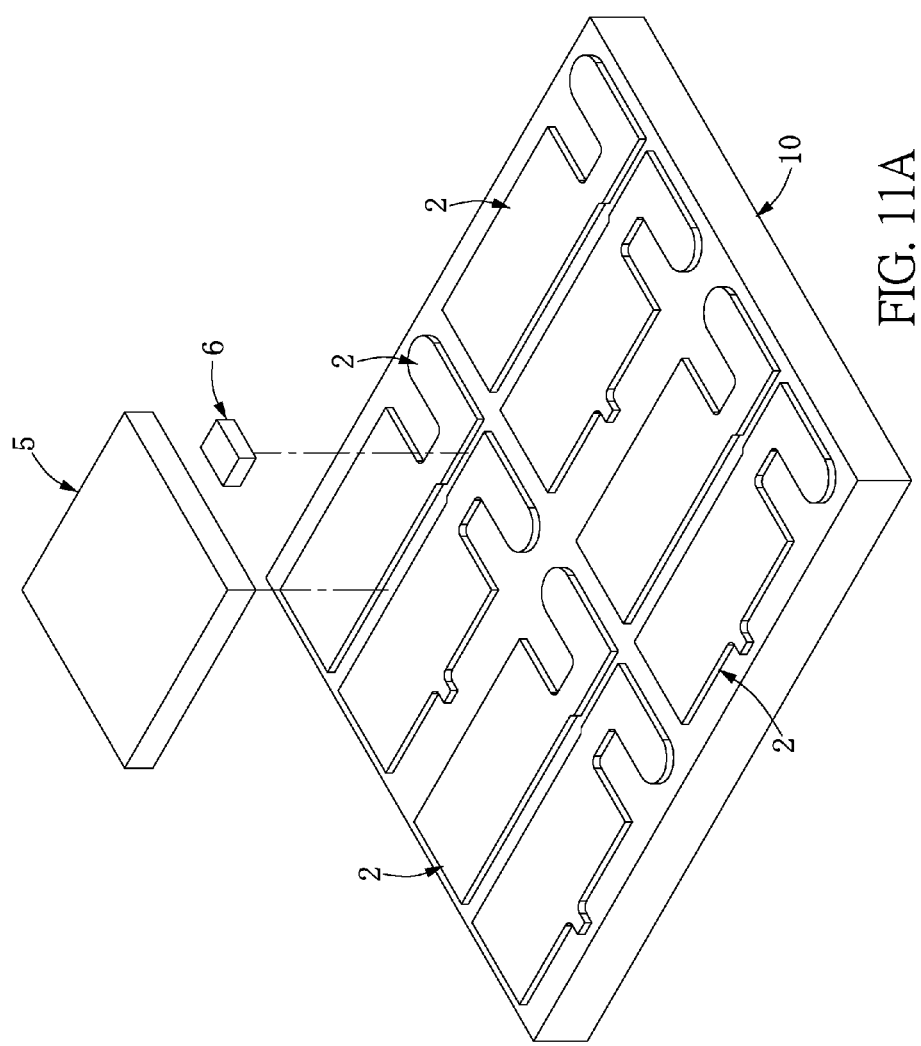
FIGS. 11A~11D are perspective views showing a manufacturing method of the LED package structure.
Figure 11B:
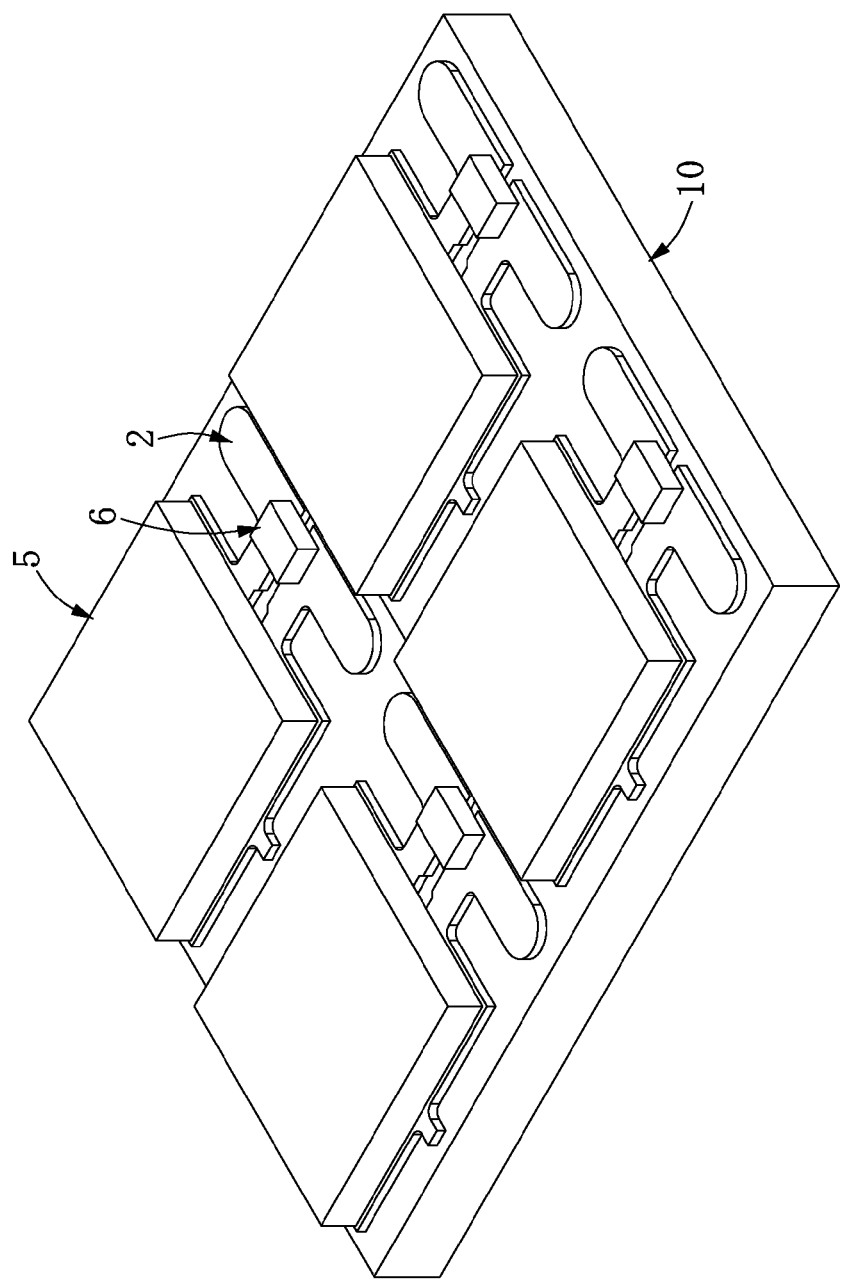

Step S110: as shown in FIGS. 11A and 11B, a plurality of circuit layers 2 are disposed on a surface of a substrate assembly 10, a plurality of soldering layers 3 (not shown in FIGS. 11A and 11B) are disposed on an opposite surface of the substrate assembly 10, a plurality of light-emitting units 5 are respectively mounted on the circuit layers 2, and a plurality of Zener diode chips 6 are respectively mounted on the circuit layers 2. The substrate assembly 10 is a construction having a plurality of substrates 1 integrally connected with each other.

Figure 11C:
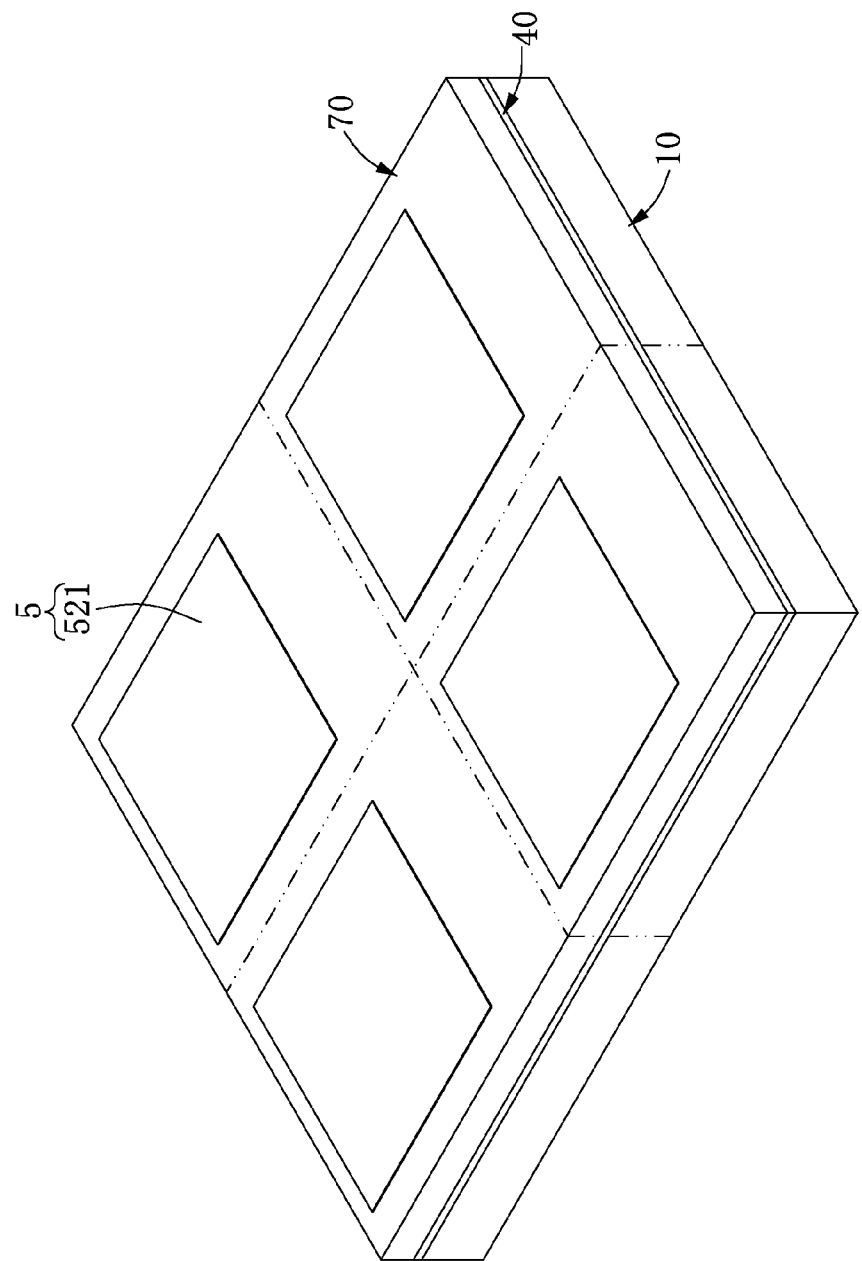

Step S130: as shown in FIGS. 11B and 11C, an insulating assembly 40 and a reflective housing assembly 70 are formed on the substrate assembly 10 by a molding manner to cover the circuit layers 2, the Zener diode chips 6, and the side surfaces of the light-emitting units 5. A top plane 521 of each light-emitting unit 5 is exposed from the reflective housing assembly 70. The insulating assembly 40 is a construction having a plurality of insulating layers 4 integrally connected with each other. The reflective housing assembly 70 is a construction having a plurality of reflective housings 7 integrally connected with each other. The insulating assembly 40 and the reflective housing assembly 70 can be formed in one-step manufacturing process or can be formed in two-step manufacturing processes.

Figure 11D:
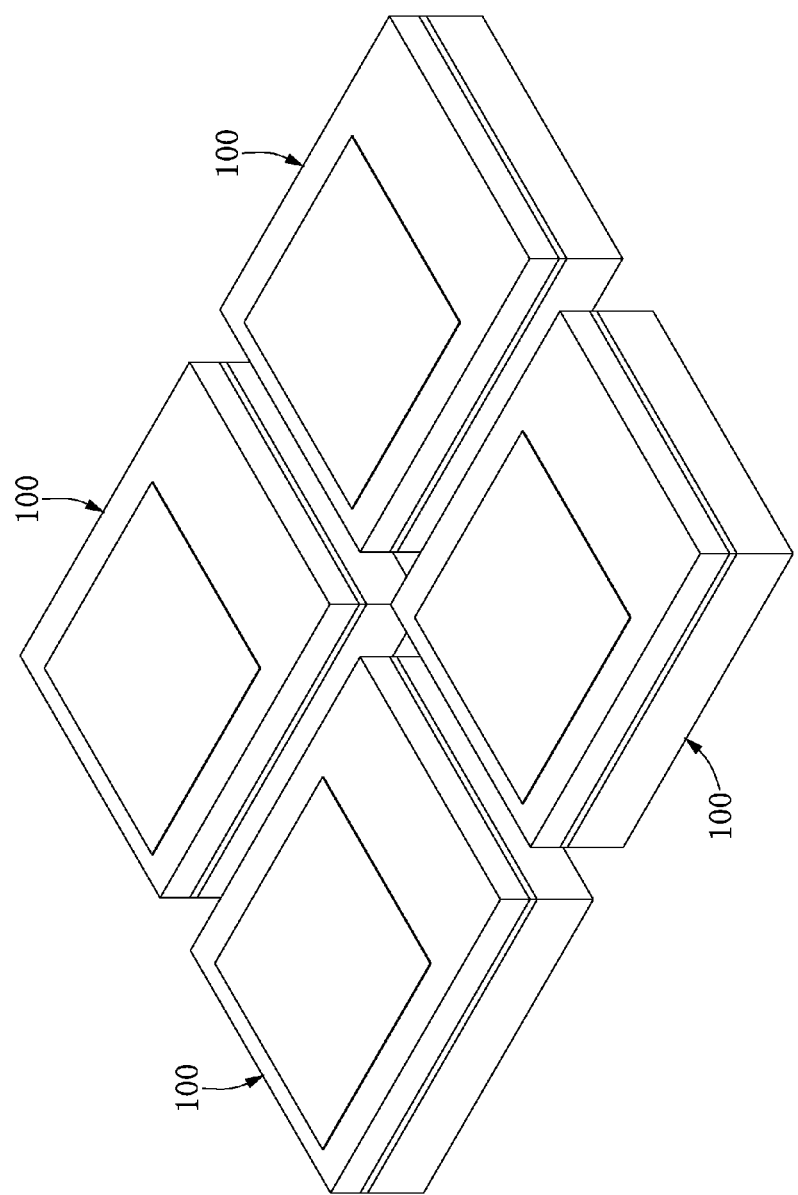

Step S150: as shown in FIGS. 11C and 11D, the reflective housing assembly 70, the insulating assembly 40, and the substrate assembly 10 are sawed into a plurality of LED package structures 100. In addition, the figures corresponding to the manufacturing method show four LED package structures 100 for example, but the instant disclosure is not limited thereto.

Second Embodiment

Please refer to FIGS. 12 through 16, which show a second embodiment. The second embodiment is similar to the first embodiment, and the identical features are not disclosed again. The different features between the two embodiments are disclosed as follows.

Figure 14:
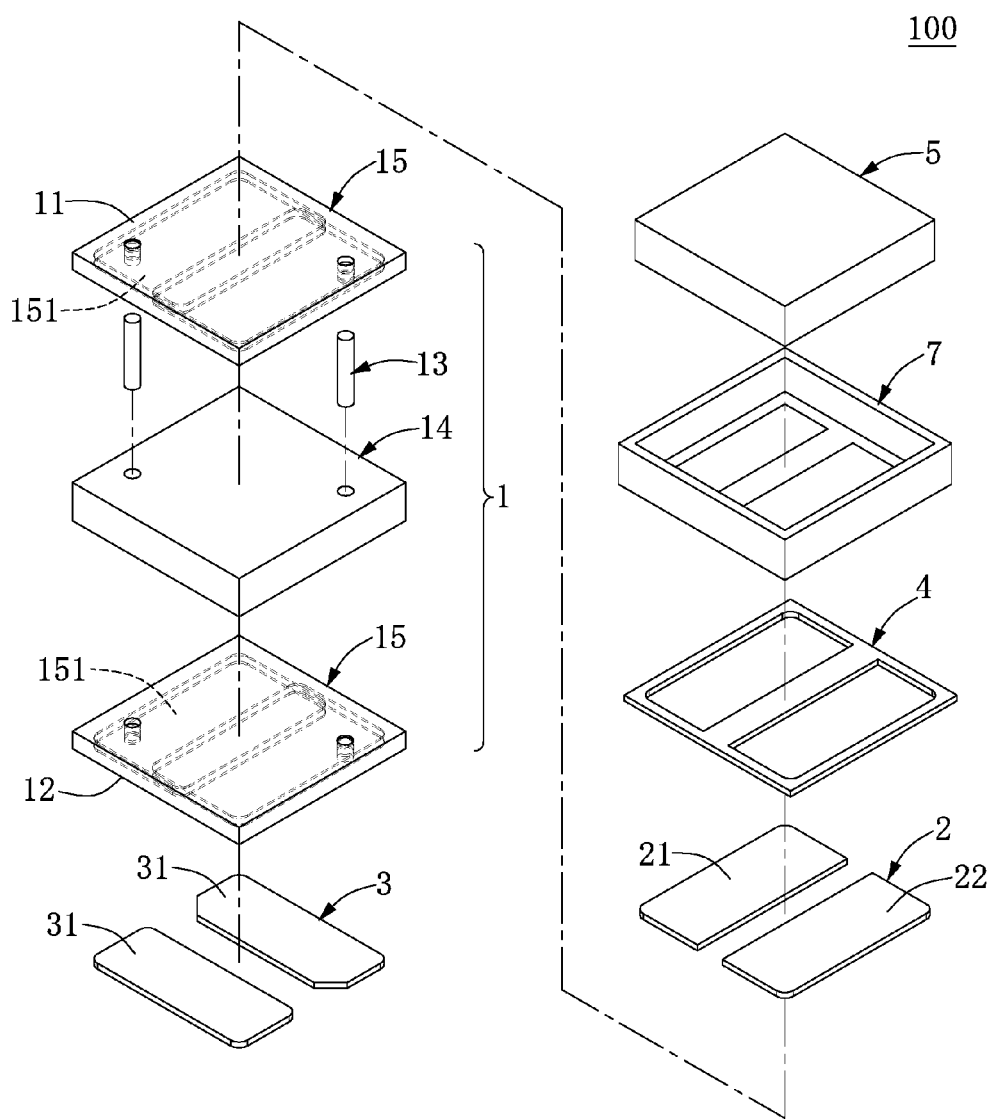
FIG. 14 is an exploded view of FIG. 12.
Figure 15:
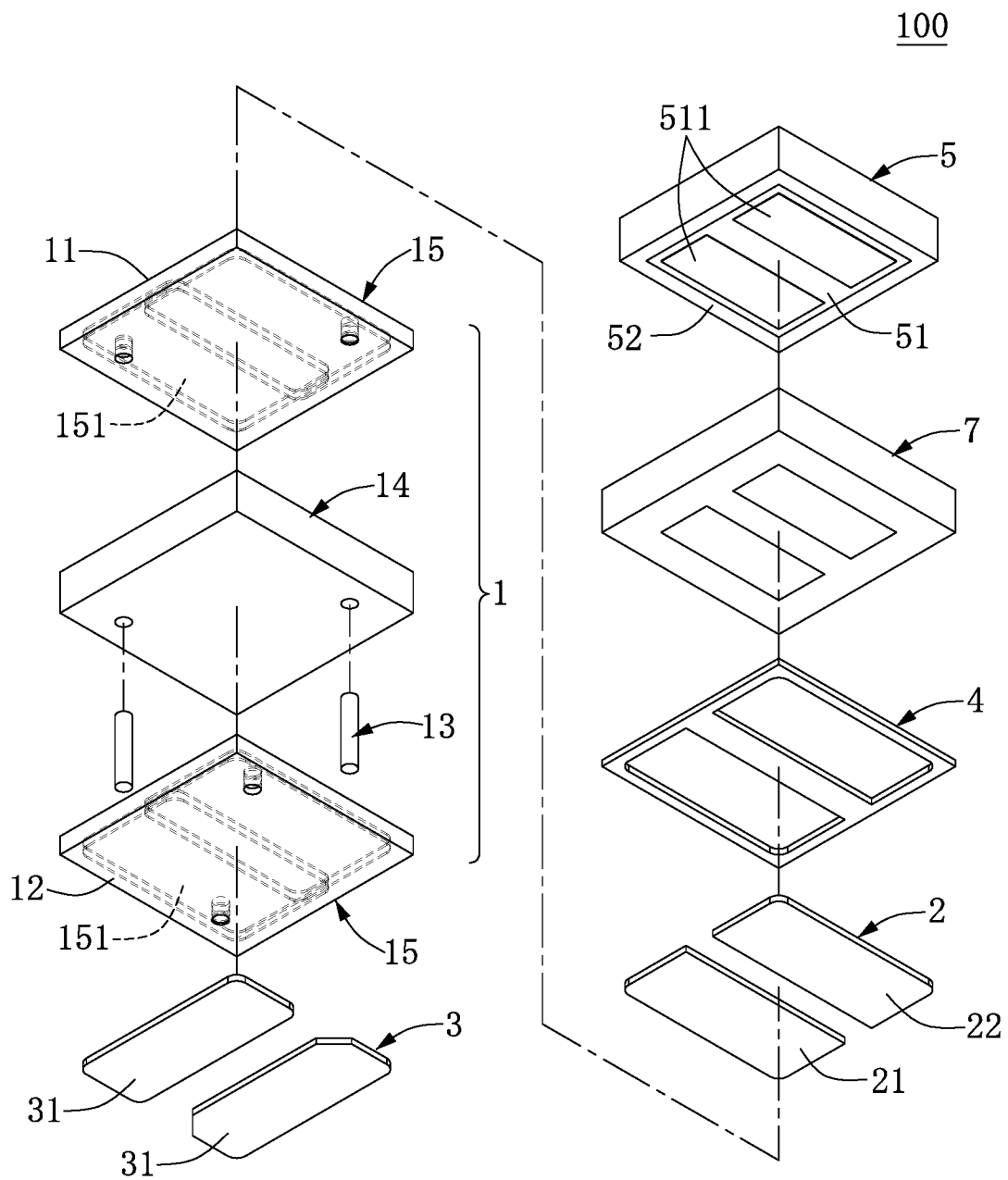
FIG. 15 is an exploded view of FIG. 13.
Figure 16:
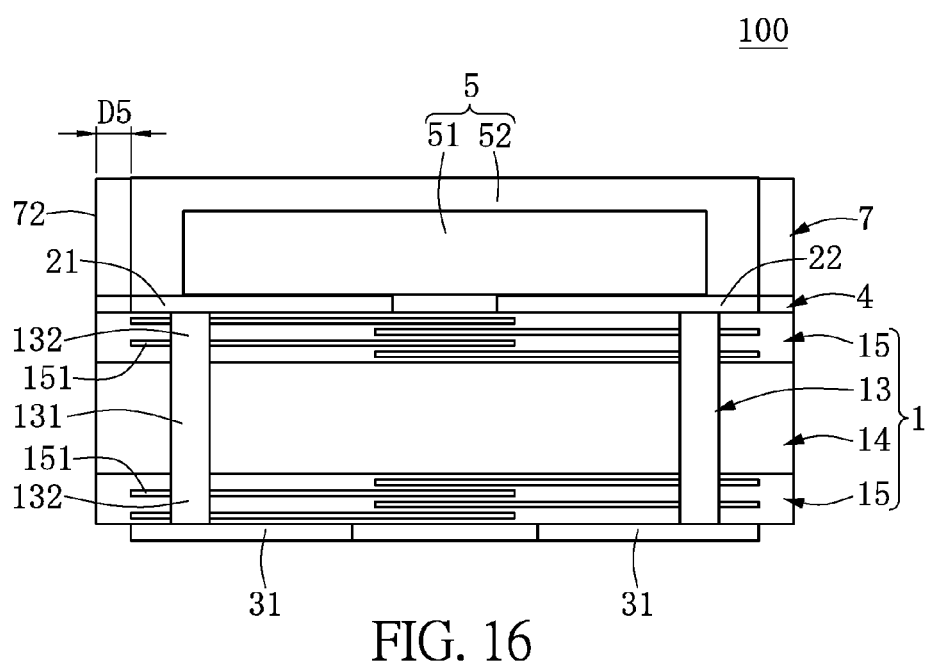
FIG. 16 is a cross-sectional view of FIG. 12 along line XVI-XVI.
Figure 17:
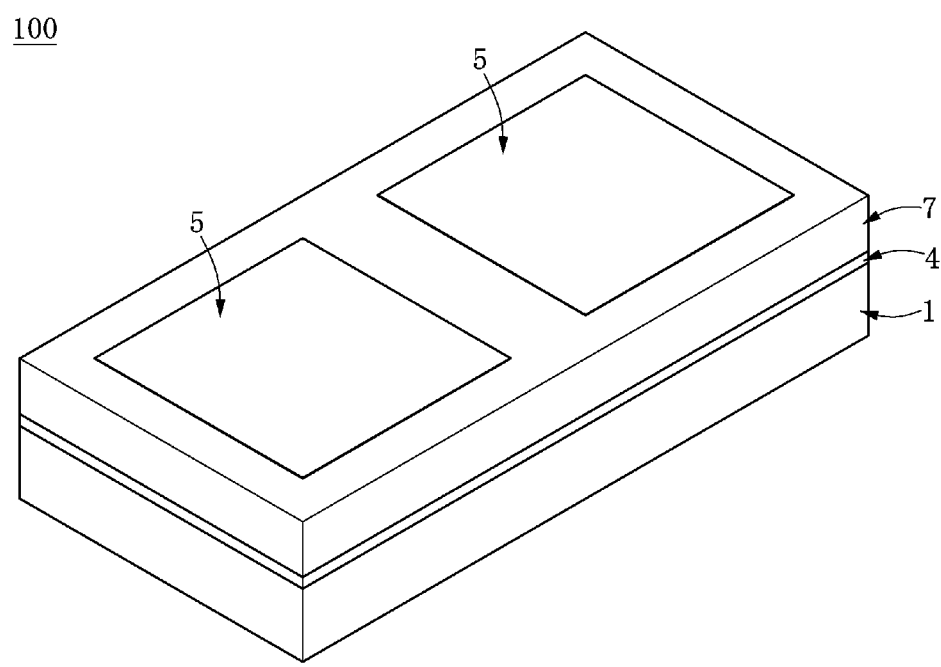
FIG. 17 is a perspective view showing the LED package structure according to a third embodiment of the instant disclosure.
Figure 18:
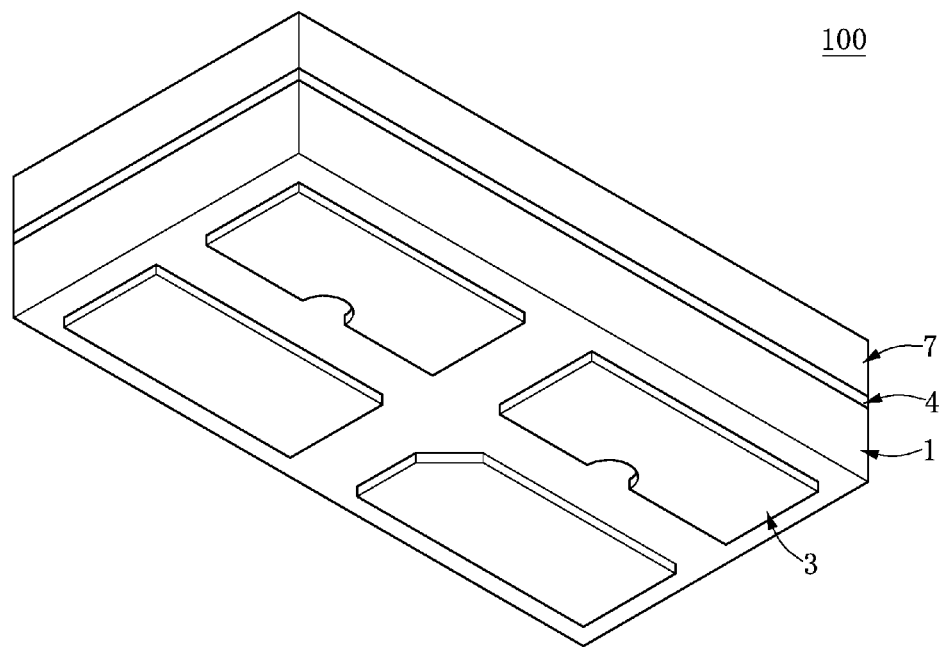
FIG. 18 is a perspective view of FIG. 17 from another perspective.
Figure 19:
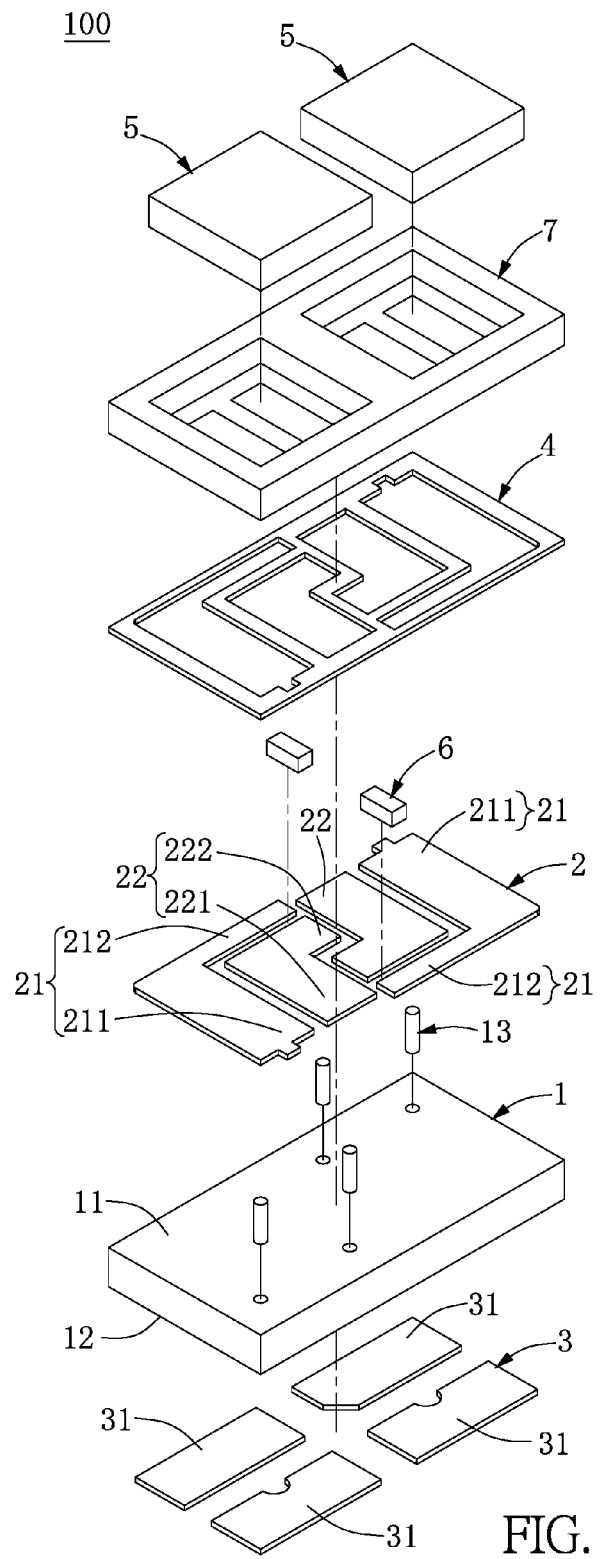
FIG. 19 is an exploded view of FIG. 17.

The LED package structure 100 of the instant embodiment is formed without the Zener diode chip 6. As shown in FIGS. 14 through 16, the substrate 1 having a substantially square shape includes a ceramic layer 14 and two varistor layers 15 respectively disposed on two opposite surfaces of the ceramic layer 14. In a non-shown embodiment, only one varistor layer 15 is disposed on one side of the ceramic layer 14. Each of the conductive pillars 13 has a first conductive pillar 131 and two second conductive pillars 132 integrally connected to two opposite ends of the first conductive pillar 131 (as shown in FIG. 16). Each of the two first conductive pillars 131 is embedded in the ceramic layer 14 and is electrically connected to the circuit layer 2 and the soldering pad 3 by using the corresponding second conductive pillars 132. Two of the second conductive pillars 132 are respectively embedded in one of the two varistor layers 15 and are connected to the circuit layer 2, and the other two second conductive pillars 132 are embedded in the other varistor layer 15 and are connected to the soldering pad 3. Each of the varistor layers 15 includes at least two metallic layers 151 connected to the two second conductive pillars 132 embedded therein to have a capacitive effect. The material of each varistor layer 15 includes zinc oxide, and the metallic layer 151 can be made of silver, gold, copper, nickel, palladium, and so on. Thus, the substrate 1 provided by the instant embodiment has a ESD function, which is identical to the Zener diode chip 6, such that the Zener diode chip 6 can be omitted to reduce the size of the LED package structure 100.

As shown in FIGS. 14 and 15, the circuit layer 2 is disposed on the first surface 11 of the substrate 1 and includes a first electrode 21 and a second electrode 22. Each of the first electrode 21 and the second electrode 22 has a substantially rectangular shape. The soldering pad 3 is disposed on the second surface 12 of the substrate 1 and includes two electrode soldering pads 31 each having a substantially rectangular shape. A longitudinal direction of each electrode soldering pad 31 is substantially perpendicular to that of each of the first electrode 31 and the second electrode 32, such that a warpage problem, which may be easily happened due to the components having different coefficients of thermal expansion (CTE), can be avoided during the manufacturing process of the LED package structure 100.

Moreover, the two conductive pillars 13 are respectively embedded in two diagonal portions of the substrate 1, and the first electrode 21 and the second electrode 22 are respectively and electrically connected to the two electrode soldering pads 31 by using the two conductive pillars 13.

The light-emitting unit 5 is mounted on the circuit layer 2, and the two chip electrodes 511 of the light-emitting unit 5 are respectively and electrically connected to the first electrode 21 and the second electrode 22. A center of the light-emitting unit 5 is substantially arranged at a central axis of the substrate 1 of the LED package structure 100. In other words, the light-emitting unit 5 in the instant embodiment is located at an optical center of the LED package structure 100.

Figure 12:
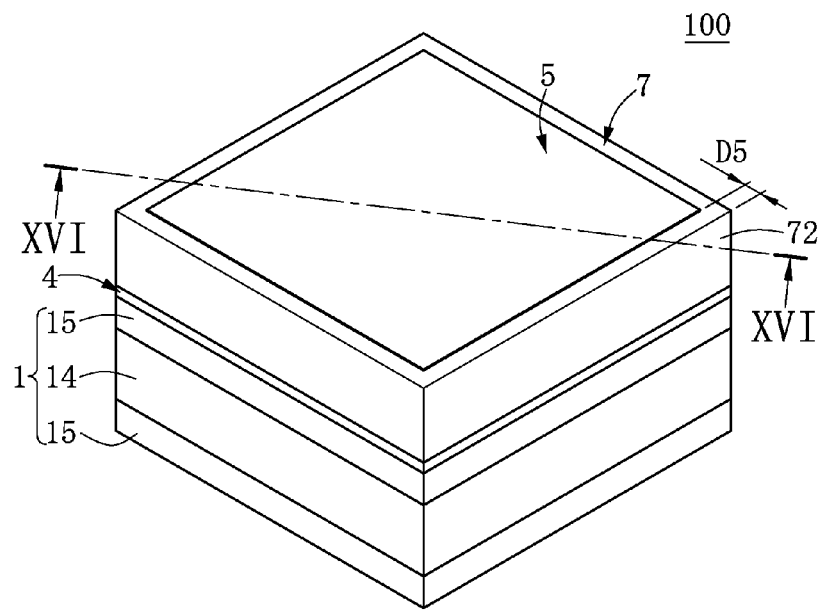
FIG. 12 is a perspective view showing the LED package structure according to a second embodiment of the instant disclosure.
Figure 13:
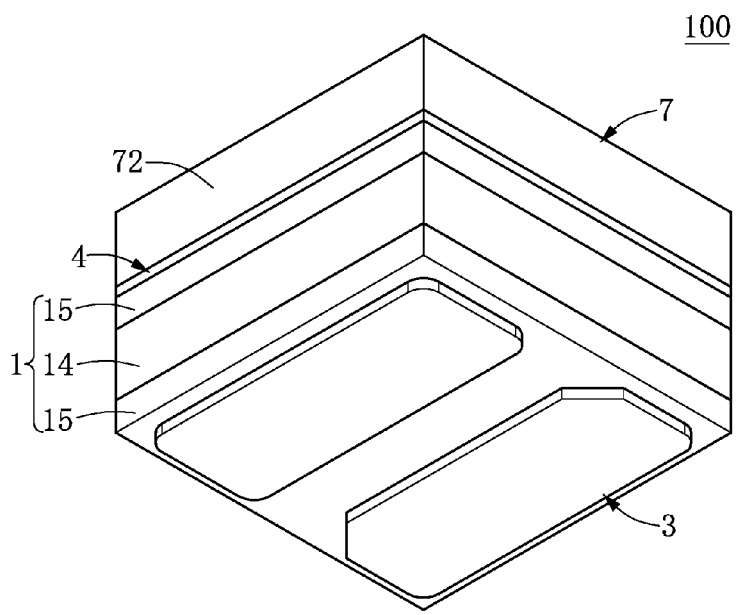
FIG. 13 is a perspective view of FIG. 12 from another perspective.

Furthermore, as shown in FIGS. 12 and 16, the insulating layer 4 and the reflective housing 7 are made of the same material and are integrally formed in one piece. The reflective housing 7 is arranged around the side surface of the light-emitting unit 5, and the outer lateral surface 72 of the reflective housing 7 is coplanar with the side surface of the substrate 1. The outer lateral surface 72 of the reflective housing 7 and the side surface 513 of the light-emitting unit 5 are parallel to each other and the distance D5 is formed there-between. The distance D5 between the outer lateral surface 72 of the reflective housing 7 and the side surface 513 of the light-emitting unit 5 is more than or equal to 100 μm and is preferably in a range of 100 μm~500 μm.

Third Embodiment

Please refer to FIGS. 17 through 22, which show a third embodiment. The third embodiment is similar to the first embodiment, and the identical features are not disclosed again. The different features between the two embodiments are disclosed as follows.

The LED package structure 100 includes two light-emitting units 5 and two Zener diode chips 6. As shown in FIGS. 17 through 20, the circuit layer 2 is disposed on the first surface 11 of the substrate 1, and the circuit layer 2 has a 2-fold rotational symmetry along a central axis perpendicular to the substrate 1. The circuit layer 2 includes two first electrodes 21 and two second electrodes 22 arranged at an inner side the two first electrodes 21. Each of the two first electrodes 21 includes an L-shaped construction having a first bonding region 211 and a first extending region 212 perpendicularly connected to the first bonding region 211. Each of the two second electrodes 22 includes an L-shaped construction having a second bonding region 221 and a second extending region 222 perpendicularly connected to the second bonding region 221.

Figure 20:
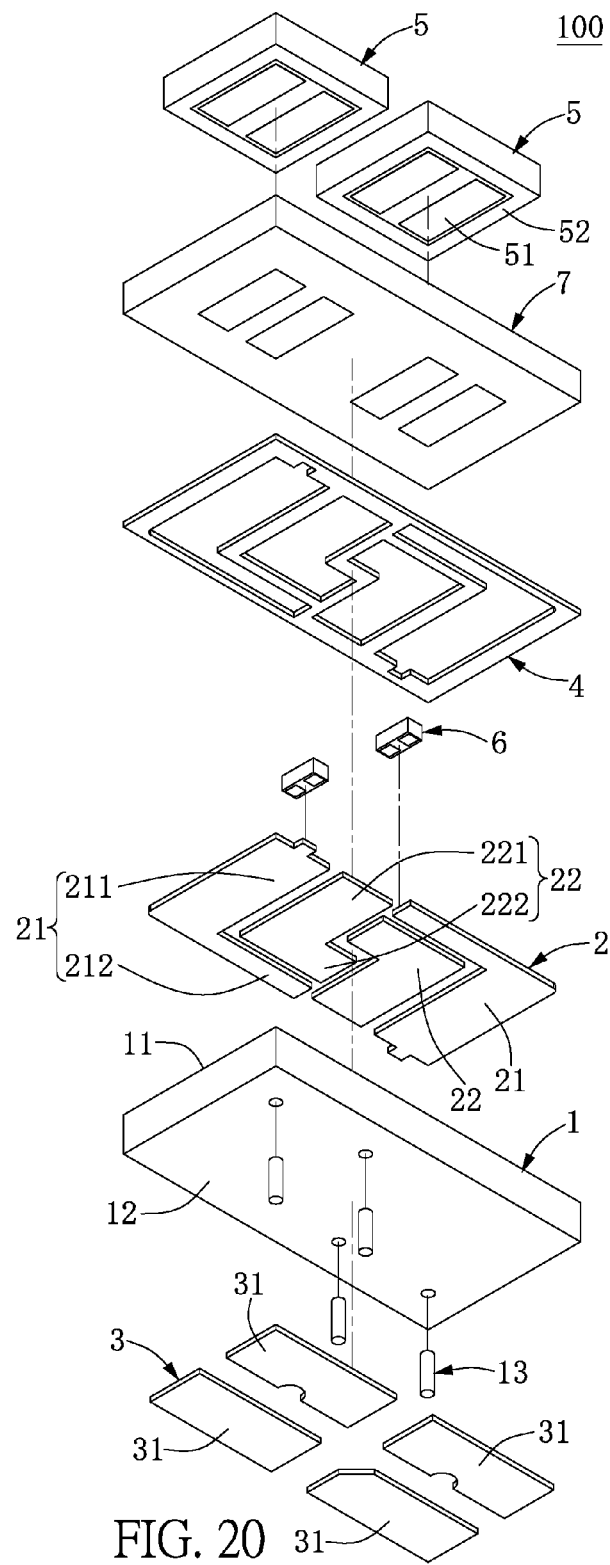
FIG. 20 is an exploded view of FIG. 18.
Figure 21:
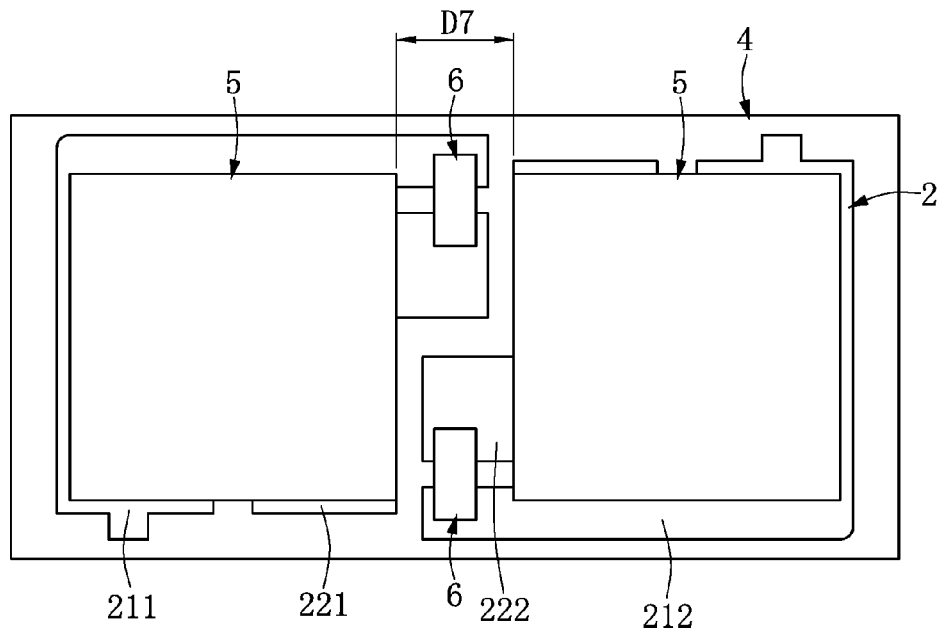
FIG. 21 is a top view of FIG. 17 that the reflective housing is omitted.

Moreover, as shown in FIGS. 19 through 22, the L-shaped constructions of the two first electrodes 21 have two corners respectively in position corresponding to two diagonal corners of the substrate 1, and the L-shaped constructions of the two second electrodes 22 have two corners respectively arranged at an inner side of the two corners of the two first electrodes 21. The second extending region 222 of each second electrode 22 is partially arranged at the inner corner of the other second electrode 22. Thus, the first electrodes 21 and the second electrodes 22 are arranged in the above arrangement, such that the patterned area of the circuit layer 2 patterned on the first surface 11 of the substrate 1 is effectively decreased, and a distance D7 between the two light-emitting units 5 (as shown in FIG. 21) is reduced accordingly, thereby increasing the light performance of the LED package structure 100.

Figure 22:
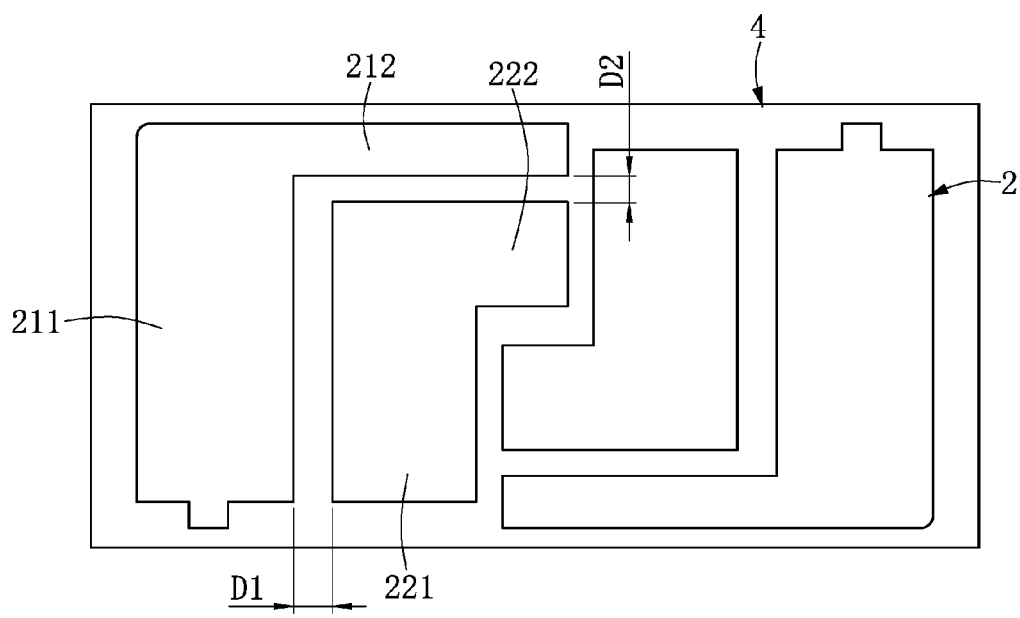
FIG. 22 is a top view of FIG. 17 that the reflective housing, the light-emitting units, and the Zener diode chips is omitted.
Figure 23:
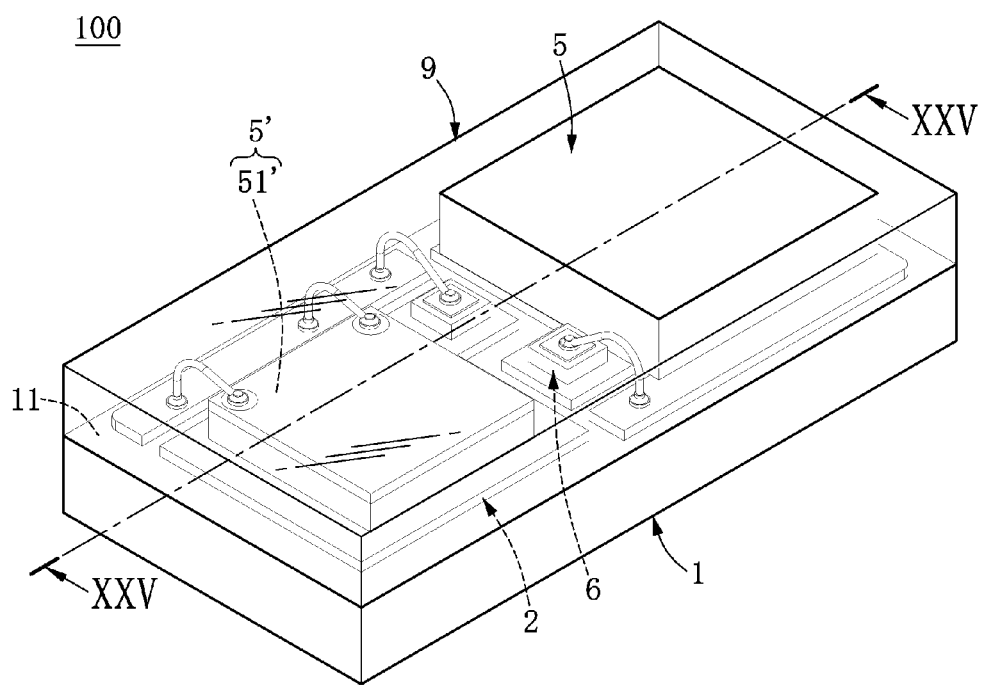
FIG. 23 is a perspective view showing the LED package structure according to a fourth embodiment of the instant disclosure.
Figure 24:
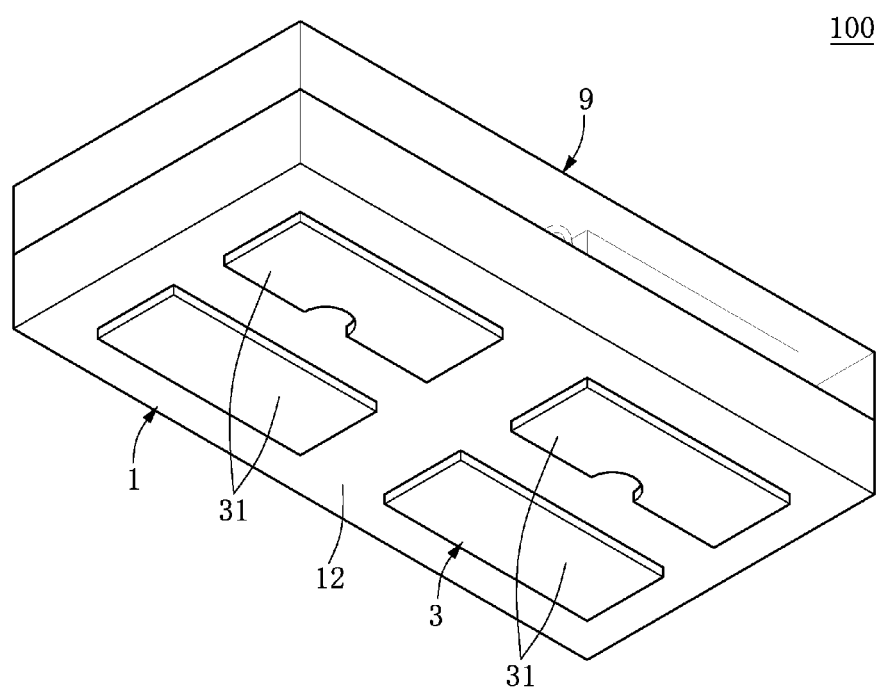
FIG. 24 is a perspective view of FIG. 23 from another perspective.
Figure 25:
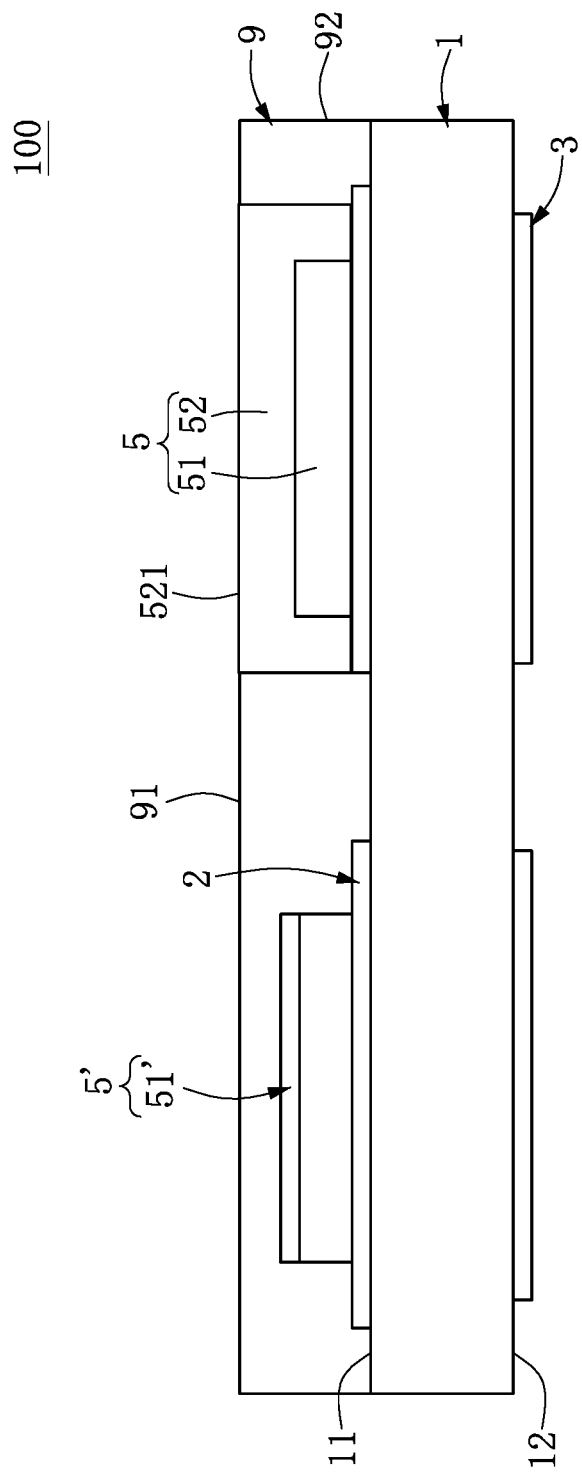
FIG. 25 is a cross-sectional view of FIG. 23 along line XXV-XXV.
Figure 26:
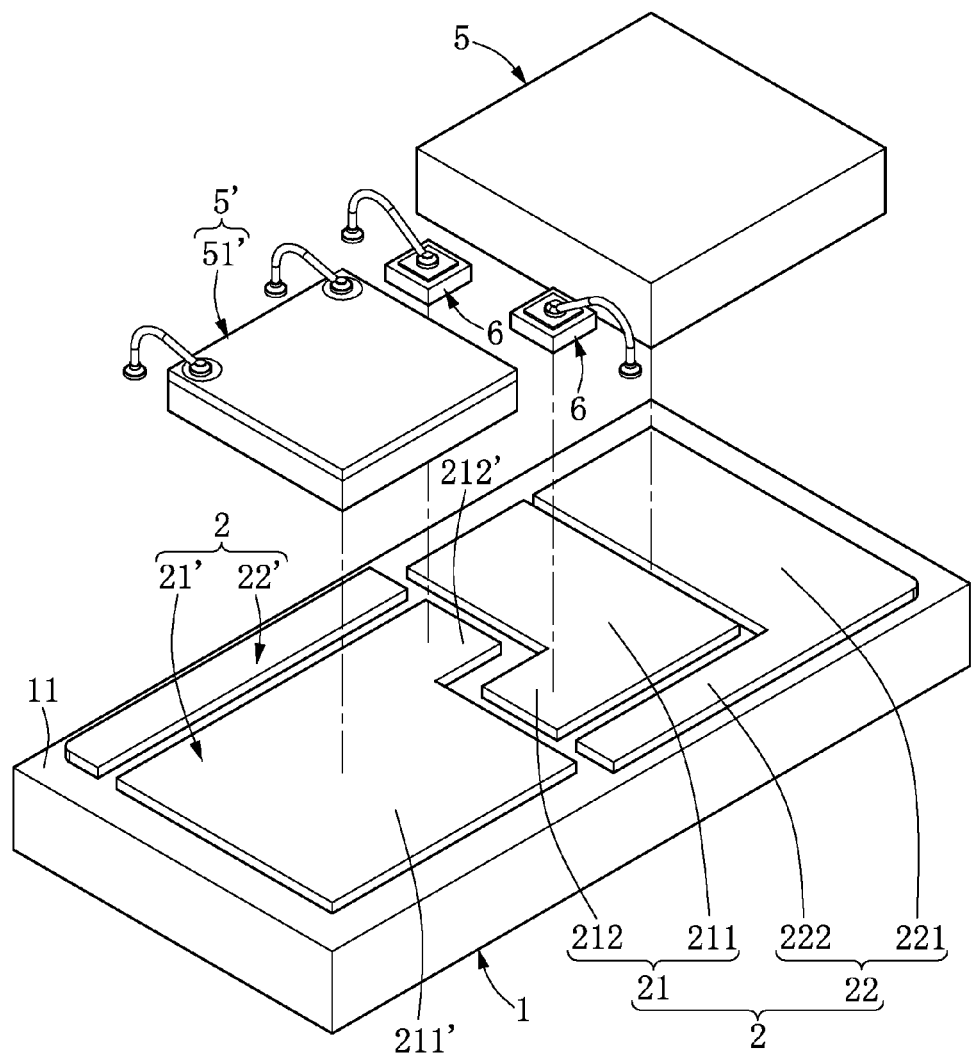
FIG. 26 is an exploded view of FIG. 23 that the light transparent layer is omitted.

Specifically, as shown in FIG. 22, a distance D1 between each first bonding region 211 and the adjacent second bonding region 221 is greater than a distance D2 between each first extending region 212 and the adjacent second extending region 222. In the instant embodiment, the distance D1 between each of the first bonding regions 211 and the second bonding regions 221 is substantially in a range of 90 μm~150 μm (i.e., 90 μm), and the distance D2 between each of the first extending regions 212 and the second extending regions 222 is substantially in a range of 150 μm~200 μm (i.e., 150 μm), but the instant disclosure is not limited thereto.

The two light-emitting units 5 having different color temperature are disposed on the circuit layer 2 and the insulating layer 4 of the substrate 1. For example, one of the two light-emitting units 5 has a warm color temperature of 1500K~4000K, and the other one of the two light-emitting unit 5 has a cool color temperature of 4000K~9000K, such that the LED package structure 100 can be prepared with a warm color temperature and a cool color temperature.

Moreover, as shown in FIGS. 20 through 22, the first bonding regions 211 and the second bonding regions 221 are in pair and are configured to connect with the two light-emitting units 5. The distance D7 between the two light-emitting units 5 is in a range of 0.1 mm~0.5 mm and is preferably in a range of 0.3 mm~0.5 mm. The distance D7 between the two light-emitting units 5 in the instant embodiment is 0.45 mm, but it is not limited thereto. The first extending regions 212 and the second extending regions 222 are in pair and are configured to connect with the Zener diode chips 6. Each of the Zener diode chips 6 can be in a flip chip manner or in a vertical chip manner, and the instant disclosure is not limited thereto.

The soldering pad 3 is disposed on the second surface 12 of the substrate 1 and includes two groups of electrode soldering pads 31. The soldering pad 3 is electrically connected to the circuit layer 2 by using the four conductive pillars 13. The two electrode soldering pads 31 of each group are respectively and electrically connected to the adjacent first electrode 21 and the adjacent second electrode 22. The two groups of electrode soldering pads 31 are respectively and electrically connected to the two light-emitting units 5 through the circuit layer 2. Accordingly, the LED package structure 100 is provided for the user with a plurality of operating modes by using the two groups of electrode soldering pads 31 to control the two light-emitting units 5.

Fourth Embodiment

Please refer to FIGS. 23 through 26, which show a fourth embodiment. The fourth embodiment is similar to the third embodiment, and the identical features are not disclosed again. The different features between the two embodiments are disclosed as follows.

The instant embodiment uses a light transparent layer 9 to replace the insulating layer 4 and the reflective housing 7 of the third embodiment, and uses a auxiliary light-emitting unit 5' to replace one of the light-emitting units 5 of the third embodiment.

The auxiliary light-emitting unit 5' in the instant embodiment is a UV LED chip 51' and is mounted on the circuit layer 2, but the instant disclosure is not limited thereto. The light transparent layer 9 is disposed on the first surface 11 of the substrate 1 to encapsulate the light-emitting unit 5 and the auxiliary light-emitting unit 5' and is filled within the gap between the light-emitting unit 5 and the circuit layer 2 (similar to FIG. 9). The circuit layer 2 and the auxiliary light-emitting unit 5' are embedded in the light transparent layer 9, and the light transparent layer 9 covers the side surface of the light-emitting unit 5, the side surface 5111 of each chip electrode 511 of the light-emitting unit 5, the bottom surface 523 of the fluorescent body 52, a side surface of the auxiliary light-emitting unit 5', and a side surface of a chip electrode of the auxiliary light-emitting unit 5'. The light transparent layer 9 includes a top plane 91 arranged away from the substrate 1 and an outer lateral surface 92 aligned with the side surface of the substrate 1. A distance between the top plane 91 of the light transparent layer 9 and the substrate 1 is equal to or less than a distance between the top plane 521 of the light-emitting unit 5 and the substrate 1. In other words, the top plane 91 of the light transparent layer 9 is substantially lower than or equal to that of the light-emitting unit 5. The distance between the two top planes 91, 521 is zero or in a range of 1~30 μm and can be in a range of 15 μm~30 μm. In the instant embodiment, the top plane 91 of the light transparent layer 9 is approximately coplanar with the top plane 521 of the light-emitting unit 5, but it is not limited thereto. More specifically, the light transparent layer 9 has an opening to expose the top plane 521 of the light-emitting unit 5.

The circuit layer 2 and the soldering pad 3 are respectively disposed on the first surface 11 and the second surface 12 of the substrate 1. The circuit layer 2 is electrically connected to the soldering pad 3 by using the conductive pillars (not shown) of the substrate 1. The soldering pad 3 includes two groups of electrode soldering pads 31, and the two groups of electrode soldering pads 31 are respectively and electrically connected to the light-emitting unit 5 and the auxiliary light-emitting unit 5' through the circuit layer 2 and the conductive pillars of the substrate 1.

Specifically, the circuit layer 2 includes two sets of the electrode pads 21, 22, 21', 22'. One set having the first electrode 21 and the second electrode 22 is provided for mounting the light-emitting unit 5, and the other set having the first electrode 21' and the second electrode 22' is provided for mounting the auxiliary light-emitting unit 5'. The first electrode 21 having an L shape includes a first bonding region 211 and a first extending region 212 extended from the first bonding region 211. The second electrode 22 having an L shape includes a second bonding region 221 and a second extending region 222 extended from the second bonding region 221. The first electrode 21' having an L shape includes a first bonding region 211' and a first extending region 212' extended from the first bonding region 211'. The two first extending regions 212, 212' are arranged adjacent to each other. The second electrode 22' has a straight shape, and the length of the second electrode 22' is equal to that of the first electrode 21'.

Moreover, the first bonding region 211 of the first electrode 21 and the second bonding region 221 of the second electrode 22 are provided for the light-emitting unit 5 having a flip chip manner and the light-emitting unit 5 is mounted thereon. The first extending region 212, 212' of the first electrode 21, 21' are provided for the Zener diode chips 6 and the Zener diode chips 6 are mounted thereon. The Zener diode chips 6 are further electrically connected to the second extending region 222 of the second electrode 22 and the second electrode 22' by wire-bonding. The first bonding region 211' of the first electrode 21' is provided for the auxiliary light-emitting unit 5' and the auxiliary light-emitting unit 5' is mounted thereon. The auxiliary light-emitting unit 5' is electrically connected to the second electrode 22' by wire-bonding.

Fifth Embodiment

Figure 27:
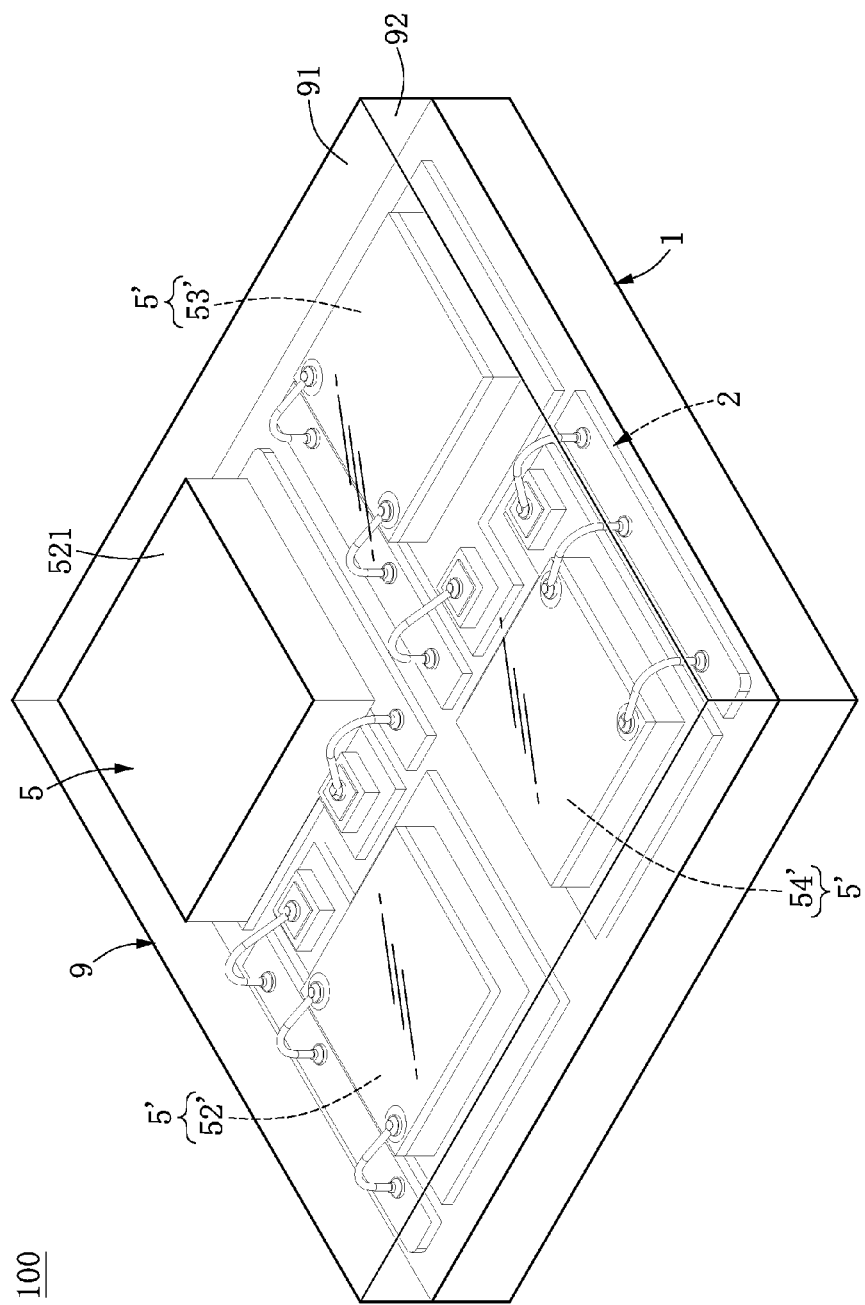
FIG. 27 is a perspective view showing the LED package structure according to a fifth embodiment of the instant disclosure.
Figure 28:
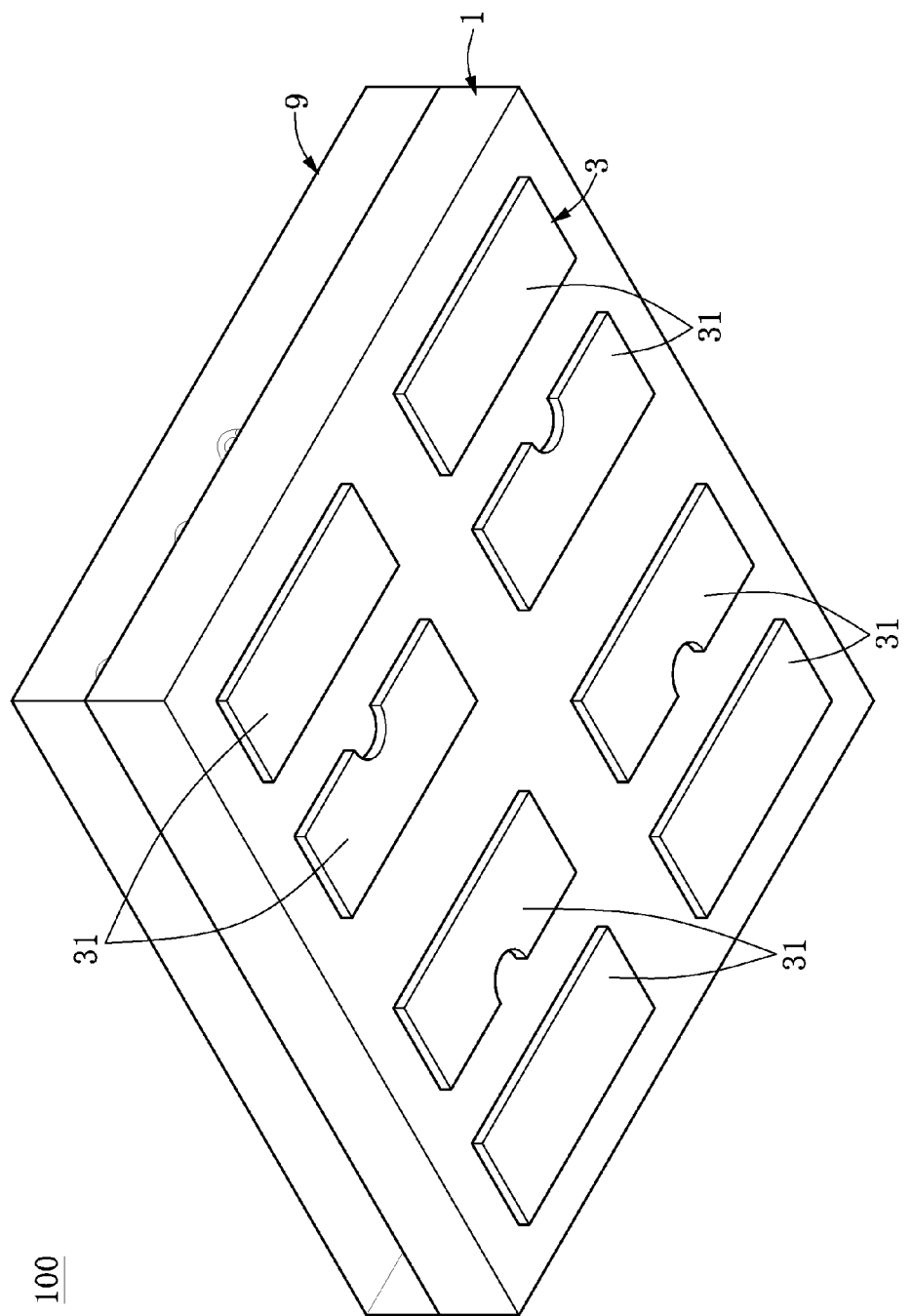
FIG. 28 is a perspective view of FIG. 27 from another perspective.
Figure 29:
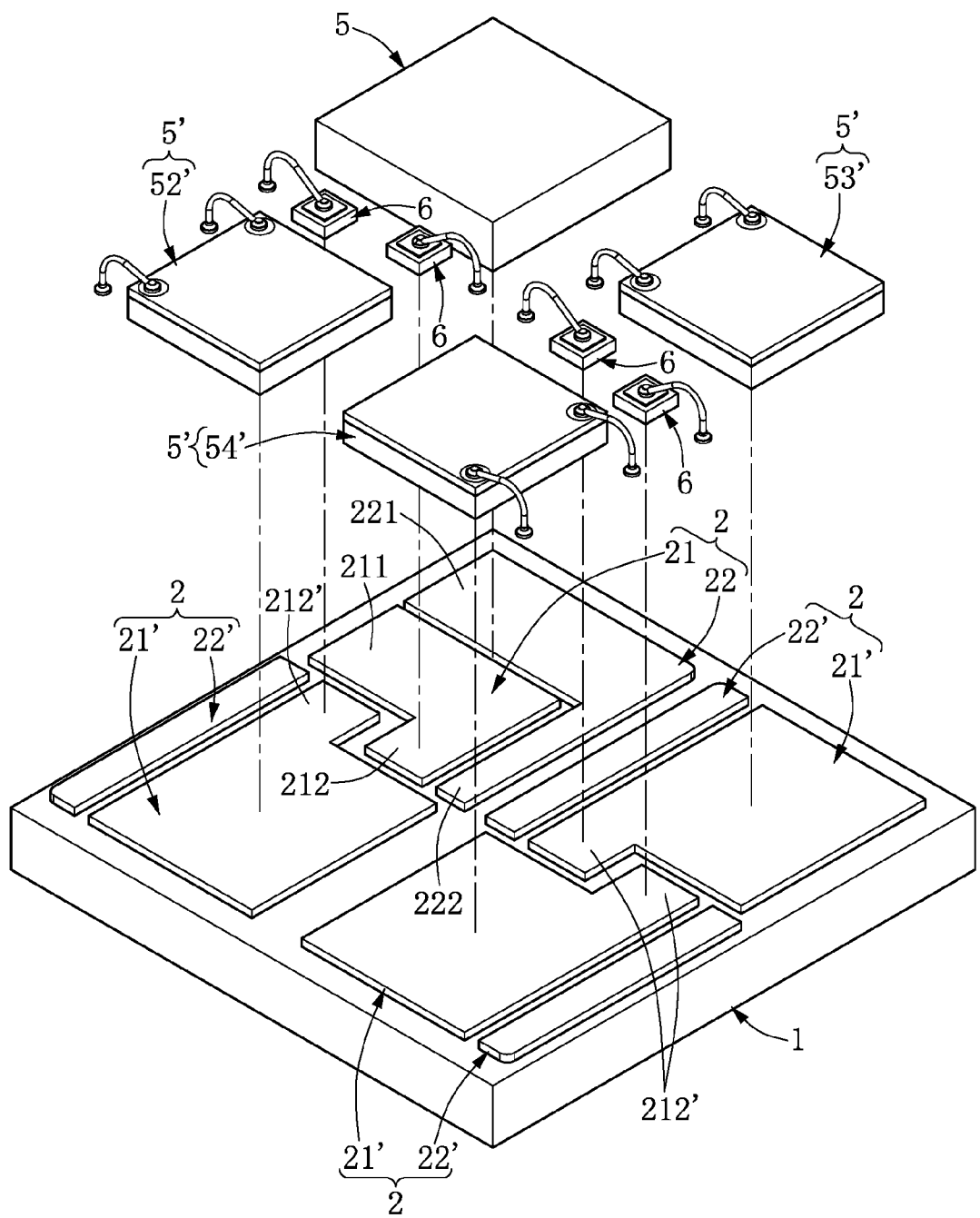
FIG. 29 is an exploded view of FIG. 27 that the light transparent layer is omitted.

Please refer to FIGS. 27 through 29, which show a fifth embodiment. The fifth embodiment is similar to the fourth embodiment, and the identical features are not disclosed again. The different features between the two embodiments are disclosed as follows.

The auxiliary light-emitting unit 5' in the instant embodiment includes a red LED chip 52', a green LED chip 53', and a blue LED chip 54', and the other components (i.e., the substrate 1, the circuit layer 2, the soldering pad 3, the Zener diode chip 6, and the light transparent layer 9) are adjusted in size and number according to the auxiliary light-emitting unit 5'. Specifically, the circuit layer 2 includes four first electrodes 21, 21' and four second electrodes 22, 22' respectively arranged adjacent to the four first electrodes 21, 21'. The four first electrodes 21, 21' are respectively cooperated with the four second electrodes 22, 22' to be classified into four sets. The light-emitting unit 5 is mounted on one of the four sets having the first electrode 21 and the second electrode 22, and the red LED chip 52', the green LED chip 53', and the blue LED chip 54' are respectively mounted on the other three sets each having the first electrode 21' and the second electrode 22'.

A half part of the circuit layer 2 for the light-emitting unit 5 and the red LED chip 52' is substantially identical to the circuit layer 2 of the fourth embodiment, and the other half part of the circuit layer 2 for the green LED chip 53' and the blue LED chip 54' are a 2-fold rotational symmetry with respect to a central axis thereof. Moreover, the first electrode 21' and the second electrode 22', which are corresponding to the red LED chip 52', are substantially mirror symmetrical to the first electrode 21' and the second electrode 22', which are corresponding to the blue LED chip 54'. The four Zener diode chips 6 are respectively mounted on the four first extending regions 212, 212' and are arranged in one row.

In addition, the light transparent layer 9 includes a top plane 91 arranged away from the substrate 1 and an outer lateral surface 92 aligned with the side surface of the substrate 1. A distance between the top plane 91 of the light transparent layer 9 and the substrate 1 is equal to or less than a distance between the top plane 521 of the light-emitting unit 5 and the substrate 1. In other words, the top plane 91 of the light transparent layer 9 is substantially lower than or equal to that of the light-emitting unit 5. The two top planes 91, 521 are parallel to each other. The distance between the two top planes 91, 521 is zero, or in a range of 1~30 µm (i.e., in a range of 0~30 µm) and is preferably in a range of 15 µm~30 µm. More specifically, the light transparent layer 9 has an opening to expose the top plane 521 of the light-emitting unit 5.

The soldering pad 3 includes four groups of electrode soldering pads 31, and the four groups of electrode soldering pads 312 are respectively and electrically connected to the light-emitting unit 5, the red LED chip 52', the green LED chip 53', and the blue LED chip 54' through the circuit layer 2 and the conductive pillars of the substrate 1.

The Effect of the Instant Embodiments

In summary, the light-emitting unit of the LED package structure of the instant disclosure is disposed on the substrate, and the fluorescent body of the light-emitting unit is spaced apart from the substrate with a gap having a range of 3 µm~10 µm. The gap is filled with the reflective housing (or the light transparent layer), such that electrical connection between the light-emitting unit and the circuit layer is not influenced by the fluorescent body, thereby the poor electrical connection can be improved. In addition, the top plane of the reflective housing is equal to that of the light-emitting unit, or the top plane of the reflective housing is lower than that of the light-emitting unit, and the distance between the two top planes is zero or in a range of 1~30 µm, thus problems about light shape and poor brightness can be avoided.

In the first embodiment, each of the light-emitting units and the Zener diode chip can be mounted on the first electrode and the second electrode because of the layout of the circuit layer, thereby reducing the size of the circuit layer. The opening of the first notch and the opening of the second notch respectively face toward two sides away from each other in the width direction of the substrate, such that the patterned area of the circuit layer patterned on the first surface of the substrate is effectively decreased, thereby increasing the area of the insulating layer covering on the first surface of the substrate. Moreover, a current leakage can be prevented through the insulating layer being arranged between the first electrode and the second electrode. The top surface and the side surface of the LED chip are encapsulated by the fluorescent body, such that the light leakage problem of the LED chip can be improved. The forward light efficiency of the LED package structure can be effectively increased and the yellow ring and blue ring can be avoided by forming the reflective housing and embedding the Zener diode chip in the reflective housing. In addition, the color uniformity of the LED package structure can be effectively increased by disposing the light diffusion layer.

In the second embodiment, the substrate has a ESD function identical to the Zener diode chip, such that the Zener diode chip can be omitted to reduce the size of the LED package structure, and the light-emitting unit 5 can be arranged at an optical center of the LED package structure. Moreover, the longitudinal direction of each electrode soldering pad is substantially perpendicular to that of each of the first electrode and the second electrode, such that a warpage problem, which is easily happened due to the components having different coefficients of thermal expansion (CTE), can be avoided during the manufacturing process of the LED package structure.

In the third embodiment, the first electrodes and the second electrodes are provided in the specific arrangement to effectively decrease the occupied area of the first surface and to reduce the distance between the two light-emitting units, thereby increasing the light performance of the LED package structure. Moreover, the LED package structure can be provided for the user with a plurality of operating modes through the two groups of electrode soldering pads to control the two light-emitting units.

The insulating layer and the reflective housing of the third embodiment is replaced by the light transparent layer in the fourth and fifth embodiments and one of the light-emitting units of the third embodiment is replaced by the auxiliary light-emitting unit for different application of the LED package structure.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. An LED package structure, comprising:
 a substrate having a first surface and a second surface opposing to the first surface;
 a circuit layer disposed on the first surface of the substrate;
 an insulating layer disposed on the first surface of the substrate, wherein the insulating layer and the circuit layer are coplanar and are arranged with a complementary shape;
 at least one light-emitting unit including an LED chip and a fluorescent body encapsulating the LED chip, the LED chip being mounted on the circuit layer and the insulating layer, and the fluorescent body being spaced apart from the circuit layer with a gap having a range of 3 µm~10 µm;
 a reflective housing disposed on the circuit layer and the insulating layer to surround the at least one light-emitting unit and further filled within the gap, such that the reflective housing is configured to cover a side surface of the at least one light-emitting unit, a side surface of a chip electrode of the least one light-emitting unit and a bottom surface of the fluorescent body, each of the reflective housing and the at least one light-emitting unit has a top plane arranged away from the substrate, the top plane of the reflective housing is substantially lower than or equal to that of the at least one light-emitting unit, and a distance between the two top planes is zero or in a range of 1~30 μm; and a soldering pad disposed on the second surface of the substrate and electrically connected to the circuit layer.

2. The LED package structure as claimed in claim 1, the circuit layer comprising:
    a first electrode including a first bonding region, a first extending region, and a first connecting region connected to the first bonding region and the first extending region, wherein a first notch is defined by the first bonding region, the first connecting region, and the first extending region; and
    a second electrode including a second bonding region, a second extending region, and a second connecting region connected to the second bonding region and the second extending region, wherein a second notch is defined by the second bonding region, the second connecting region, and the second extending region, wherein an opening of the first notch and an opening of the second notch respectively face toward two sides away from each other, and the first electrode and the second electrode are substantially arranged in a mirror symmetry;
    wherein the LED chip is mounted on the first bonding region and the second bonding region, and a Zener diode chip is mounted on the first extending region and the second extending region.

3. The LED package structure as claimed in claim 2, wherein a distance between the first bonding region and the second bonding region is greater than a distance between the first extending region and the second extending region.

4. The LED package structure as claimed in claim 1, wherein the fluorescent body encapsulates a top surface of the LED chip and a side surface of the LED chip and exposes at least two chip electrodes of the LED chip, the top surface of the LED chip is parallel to a top surface of the fluorescent body, and a smallest distance between the top surface of the LED chip and the top surface of the fluorescent body is in a range of 50 μm~200 μm.

5. The LED package structure as claimed in claim 1, wherein the reflective housing includes an outer lateral surface, and a smallest distance between the at least one light-emitting unit and the outer lateral surface of the reflective housing is more than or equal to 100 μm.

6. The LED package structure as claimed in claim 1, wherein the two top planes are parallel to each other, and the distance between the two top planes is in a range of 15 μm~30 μm.

7. The LED package structure as claimed in claim 1, further comprising a Zener diode chip disposed on the circuit layer and embedded in the reflective housing.

8. The LED package structure as claimed in claim 1, further comprising a light diffusion layer disposed on the reflective housing and the fluorescent body, wherein a thickness of the light diffusion layer is less than or equal to 50 μm, and the light diffusion layer includes silica or titanium dioxide having a weight percent of 2 wt %~5 wt %.

9. The LED package structure as claimed in claim 1, wherein the soldering pad includes two electrode soldering pads and a heat-dissipating soldering pad, the two electrode soldering pads are electrically connected to the circuit layer, and the two electrode soldering pads are electrically connected to the LED chip through the circuit layer, the heat-dissipating soldering pad is arranged on one side of the two electrode soldering pads and is under the LED chip for dissipating heat generated from the LED chip.

10. The LED package structure as claimed in claim 1, wherein the substrate includes a ceramic layer, at least one varistor layer arranged on one side of the ceramic layer, two first conductive pillars embedded in the ceramic layer, and two second conductive pillars embedded in the at least one varistor layer, wherein the two first conductive pillars are respectively and electrically connected to the two second conductive pillars, the first conductive pillars and the second conductive pillars are electrically connected to the circuit layer and the soldering pad, and the at least one varistor layer includes at least two metallic layers electrically connected to the two second conductive pillars to have a capacitive effect.

11. The LED package structure as claimed in claim 1, wherein at least two light-emitting units having different color temperature are disposed on the circuit layer and the insulating layer, and a distance between the two light-emitting units is in a range of 0.3 mm~0.5 mm.

12. The LED package structure as claimed in claim 11, wherein the distance between the two light-emitting units is 0.45 mm, one of the two light-emitting units has a color temperature of 1500K~4000K, and the other one of the two light-emitting units has a color temperature of 4000K~9000K.

13. The LED package structure as claimed in claim 11, further comprising two Zener diode chips, wherein the circuit layer comprises:
    two first electrodes, wherein each of the two first electrodes includes an L-shaped construction having a first bonding region and a first extending region perpendicularly connected to the first bonding region; and
    two second electrodes arranged at an inner side the two first electrodes, wherein each of the two second electrodes includes an L-shaped construction having a second bonding region and a second extending region perpendicularly connected to the second bonding region;
    wherein the L-shaped constructions of the two first electrodes have two corners respectively in position corresponding to two diagonal corners of the substrate, and the L-shaped constructions of the two second electrodes have two corners respectively arranged at an inner side of the two corners of the two first electrodes; the first bonding regions and the second bonding regions are in pairs and are configured to connect with the two light-emitting units, and the first extending regions and the second extending regions are in pairs and are configured to connect with the Zener diode chips.

14. The LED package structure as claimed in claim 13, wherein the circuit layer has a 2-fold rotational symmetry along a central axis perpendicular to the substrate, a distance between each of the first bonding regions and the second bonding regions is substantially in a range of 90 μm~150 μm, and a distance between each of the first extending regions and the second extending regions is substantially in a range of 150 μm~200 μm.

15. The LED package structure as claimed in claim 1, wherein the at least one light-emitting unit includes a reflecting cup at least surrounded a side surface of the LED chip.

16. The LED package structure as claimed in claim 15, wherein the at least one light-emitting unit includes a transparent body at least surrounded the side surface of the LED chip, and the reflecting cup surrounds the transparent body.

17. The LED package structure as claimed in claim 1, wherein the reflective housing and the insulating layer are integrally formed in one piece.

18. An LED package structure, comprising:
a substrate having a first surface and a second surface opposing to the first surface;
a circuit layer disposed on the first surface of the substrate;
at least one light-emitting unit including an LED chip and a fluorescent body encapsulating the LED chip, the LED chip being mounted on the circuit layer, the fluorescent body is spaced apart from the circuit layer, and the fluorescent body being spaced apart from the circuit layer with a gap having a range of 3 μm~10 μm;
at least one auxiliary light-emitting unit mounted on the circuit layer;
a light transparent layer disposed on the substrate to encapsulate the at least one light-emitting unit and the at least one auxiliary light-emitting unit, such that the light transparent layer is configured to cover a side surface of the light-emitting unit, a side surface of a chip electrode of the at least one light-emitting unit, a bottom surface of the fluorescent body, a side surface of the at least one auxiliary light-emitting unit, and a side surface of a chip electrode of the at least one auxiliary light-emitting unit, each of the light transparent layer and the light-emitting unit has a top plane arranged away from the substrate, the top plane of the light transparent layer is substantially lower than or equal to that of the light-emitting unit, and a distance between the two top planes is zero or in a range of 1~30 μm; and
a soldering pad disposed on the second surface of the substrate and electrically connected to the circuit layer, wherein the soldering pad includes at least two groups of electrode soldering pads respectively and electrically connected to the at least one light-emitting unit and the at least one auxiliary light-emitting unit.

19. The LED package structure as claimed in claim 18, wherein the auxiliary light-emitting unit is selected from the group consisting of a UV LED chip, a red LED chip, a green LED chip, and a blue LED chip.

20. The LED package structure as claimed in claim 18, wherein the light-emitting unit includes a reflecting cup surrounded a side surface of the LED chip.

\* \* \* \* \*